(12) United States Patent
Choi

(10) Patent No.: US 10,262,705 B2
(45) Date of Patent: Apr. 16, 2019

(54) ELECTRONIC DEVICE AND METHOD OF OPERATING THE SAME

(71) Applicant: SK hynix Inc., Icheon-si, Gyeonggi-do (KR)

(72) Inventor: Uguen Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/700,585

(22) Filed: Sep. 11, 2017

(65) Prior Publication Data

US 2018/0233184 A1    Aug. 16, 2018

(30) Foreign Application Priority Data

Feb. 14, 2017  (KR) ........................ 10-2017-0020029

(51) Int. Cl.
| | | |
|---|---|---|
| *G11C 7/10* | (2006.01) | |
| *G11C 7/22* | (2006.01) | |
| *G11C 16/32* | (2006.01) | |
| *G11C 5/06* | (2006.01) | |
| *G11C 16/06* | (2006.01) | |
| *H03K 3/00* | (2006.01) | |
| *H03K 5/00* | (2006.01) | |

(52) U.S. Cl.
CPC .............. *G11C 7/222* (2013.01); *G11C 5/063* (2013.01); *G11C 7/1006* (2013.01); *G11C 7/1066* (2013.01); *G11C 7/1093* (2013.01); *G11C 16/06* (2013.01); *G11C 16/32* (2013.01); *H03K 3/00* (2013.01); *H03K 2005/00052* (2013.01)

(58) Field of Classification Search
CPC ...................................................... G11C 16/32
See application file for complete search history.

(56) References Cited

U.S. PATENT DOCUMENTS

| | | | | |
|---|---|---|---|---|
| 2009/0040847 A1* | 2/2009 | Lee | ...................... | G11C 7/1051 365/194 |
| 2015/0364173 A1* | 12/2015 | Kim | ...................... | G11C 7/222 365/189.02 |

FOREIGN PATENT DOCUMENTS

KR    1020150143943 A    12/2015

\* cited by examiner

*Primary Examiner* — Uyen B Tran
(74) *Attorney, Agent, or Firm* — William Park & Associates Ltd.

(57) ABSTRACT

Provided herein may be a semiconductor memory device. The semiconductor memory device may include a memory unit configured to store the write data. The semiconductor memory device may include an interface chip configured to receive a first timing signal and a second timing signal, and configured to detect a locking delay from the first timing signal and generate a third timing signal from the second timing signal generated by delaying the first timing signal using the detected locking delay by at least two periods.

18 Claims, 25 Drawing Sheets

ELECTRONIC DEVICE AND METHOD OF OPERATING THE SAME

CROSS-REFERENCE TO RELATED APPLICATION

The present application claims priority under 35 U.S.C. § 119(a) to Korean patent application number 10-2017-0020029 filed on Feb. 14, 2017 in the Korean Intellectual Property Office, the entire disclosure of which is incorporated herein by reference.

BACKGROUND

1. Technical Field

Various embodiments of the present disclosure may generally relate to an electronic device, and more particularly, to a storage device and a method of operating the storage device.

2. Related Art

Generally, a storage device is a device which stores data under the control of a host device such as a computer, a smartphone, or a smartpad. Examples of the storage device include a device such as a hard disk drive (HDD) which stores data in a magnetic disk, and a device such as a solid state drive (SSD) or a memory card which stores data in a semiconductor memory, particularly, a nonvolatile memory.

Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

Through the development of semiconductor manufacturing technology, the capacity and the speed of such storage devices are increasing. The increase in capacity of a storage device is achieved not only by high integration of a semiconductor memory chip but also by overlapping a plurality of semiconductor memory chips. The increase in speed of the storage device may be achieved by using a dual data rate (DDR) method in lieu of a single data rate (SDR) method.

However, the increase in capacity and speed of the storage device may reduce the reliability of the storage device. For example, as the number of overlapped semiconductor chips is increased, a resistance component to be generated by the semiconductor chips is increased. If the resistance component is increased, a toggle speed of a channel communicating with the semiconductor chips is reduced. The reduction in toggle speed of the channel may increase a skew. Particularly, the higher the speed of the storage device, the lower the reliability of the storage device due to the increase in skew. Therefore, as the capacity and the speed of the storage device are increased, a method of embodying storage devices having improved reliability is required.

SUMMARY

An embodiment of the present disclosure may provide for a storage device. The storage device may include a semiconductor memory device. The storage device may include a memory controller configured to control the semiconductor memory device and transmit write data and a first timing signal to the semiconductor memory device during a write operation. The semiconductor memory device may include a memory unit configured to store the write data. The semiconductor memory device may include an interface chip configured to detect a locking delay from the first timing signal and generate a third timing signal from a second timing signal generated by delaying the first timing signal using the detected locking delay by at least two periods.

An embodiment of the present disclosure may provide for a semiconductor memory device. The semiconductor memory device may include a memory unit configured to store the write data. The semiconductor memory device may include an interface chip configured to receive a first timing signal and a second timing signal, and configured to detect a locking delay from the first timing signal and generate a third timing signal from the second timing signal generated by delaying the first timing signal using the detected locking delay by at least two periods.

DETAILED DESCRIPTION

Figure 1:
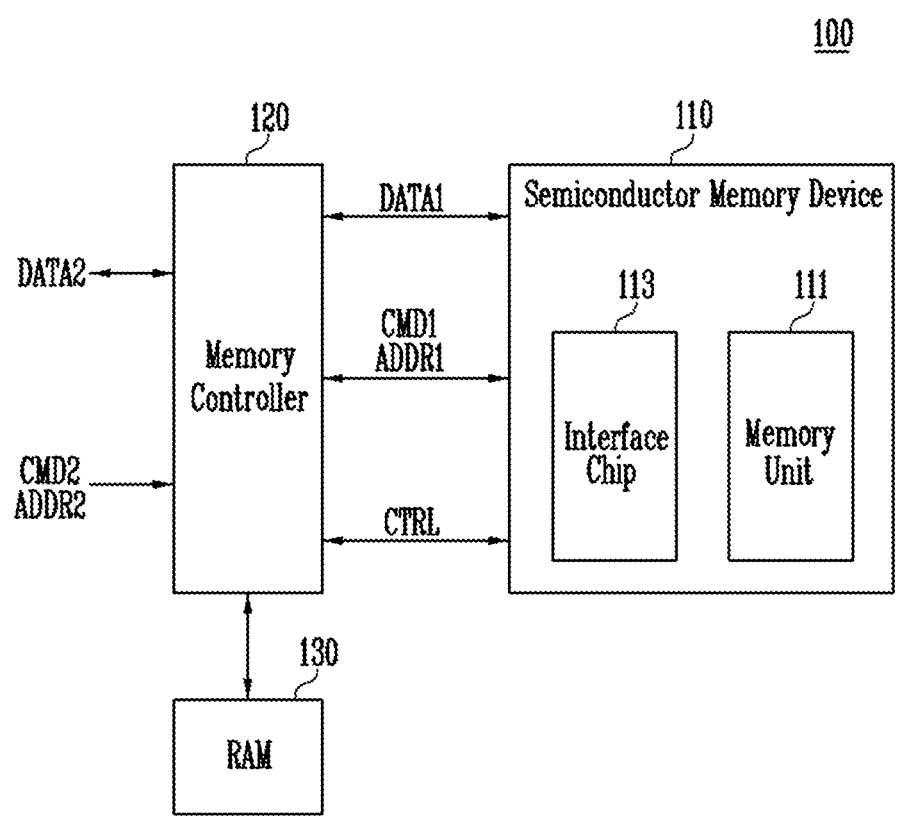
FIG. 1 is a block diagram illustrating a storage device in accordance with an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure may be embodied in many different forms and should not be construed as being limited to only the embodiments set forth herein, but should be construed as covering modifications, equivalents or alternatives falling within ideas and technical scopes of the present disclosure.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component. It will be understood that when an element is referred to as being "between" two elements, it can be the only element between the two elements, or one or more intervening elements may also be present.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Further, the logic levels of the signals may be different from or the opposite of those described. For example, a signal described as having a logic "high" level may alternatively have a logic "low" level, and a signal described as having a logic "low" level may alternatively have a logic "high" level.

Detailed description of functions and structures well known to those skilled in the art will be omitted to avoid obscuring the subject matter of the present disclosure. This aims to omit unnecessary description to make the subject matter of the present disclosure clear.

Various embodiments of the present disclosure will now be described hereinafter with reference to the accompanying drawings, in which preferred embodiments of the present disclosure are illustrated, so that those of ordinary skill in the art can easily carry out the technical idea of the present disclosure.

Various embodiments of the present disclosure may be directed to a storage device having improved reliability, and a method of operating the storage device.

FIG. 1 is a block diagram illustrating a storage device 100 in accordance with an embodiment of the present disclosure.

Referring to FIG. 1, the storage device 100 may include a semiconductor memory device 110, a memory controller 120, and a RAM 130.

The semiconductor memory device 110 may perform a write, read, or erase operation under the control of the memory controller 120. The semiconductor memory device 110 may exchange first data DATA1 with the memory controller 120. For example, the semiconductor memory device 110 may receive write data from the memory controller 120 and write the write data. The semiconductor memory device 110 may perform a read operation and output read data to the memory controller 120.

The semiconductor memory device 110 may receive a first command CMD1 and a first address ADDR1 from the memory controller 120. In an embodiment, the semiconductor memory device 110 may exchange a control signal CTRL with the memory controller 120. For example, the semiconductor memory device 110 may receive, from the memory controller 120, at least one of a chip select signal /CE which is used to select a memory unit 111 included in the semiconductor memory device 110, a command latch enable signal CLE which indicates that a signal received from the memory controller 120 is the first command CMD1, an address latch enable signal ALE which indicates that a signal received from the memory controller 120 is the first address ADDR1, a read enable signal /RE which is generated by the memory controller 120 during a read operation and is periodically toggled and used to tune the timing, a write enable signal /WE which is enabled by the memory controller 120 when the first command CMD1 or the first address ADDR1 is received, a write protection signal /WP which is enabled by the memory controller 120 to prevent an undesirable write or erase operation from being performed when power changes, and a data strobe signal DQS which is generated by the memory controller 120 during a write operation and is periodically toggled and used to synchronize an input of the first data DATA1.

In an embodiment, the semiconductor memory device 110 may output, to the memory controller 120, at least one of a ready/busy signal R/nB which indicates whether the semiconductor memory device 110 is performing any one of the write, the erase and the read operations, and a data strobe signal DQS which is generated from a read enable signal /RE received from the memory controller 120 by the semiconductor memory device 110 and is periodically toggled and used to synchronize an output of the first data DATA1.

The semiconductor memory device 110 may include the memory unit 111 and an interface chip 113. The memory unit 111 may communicate with the memory controller 120 through the interface chip 113. The interface chip 113 may mediate communication between the memory unit 111 and the memory controller 120. The interface chip 113 may perform a retiming operation for data to be exchanged between the memory controller 120 and the memory unit 111. The retiming operation may include a buffering operation of storing and outputting data to be transmitted. If data to be transmitted is stored and outputted, the timing of the data to be transmitted may be rearranged, whereby skew may be reduced. In other words, the interface chip 113 may rearrange data to be exchanged between the memory unit 111 and the memory controller 120, thus enhancing the reliability of the storage device 100.

The semiconductor memory device 110 may include a nonvolatile memory. For example, the semiconductor memory device 110 may include a flash memory. However, the semiconductor memory device 110 is not limited to including the flash memory. The semiconductor memory device 110 may include at least one of various nonvolatile memories such as a phase-change RAM (PRAM), a magnetic RAM (MRAM), a resistive RAM (RRAM), and a ferroelectric RAM (FeRAM).

The memory controller 120 may control the semiconductor memory device 110. For instance, the memory controller 120 may control the semiconductor memory device 110 so that a write, a read, or an erase operation is performed. The memory controller 120 may exchange the first data DATA1 and the control signal CTRL with the semiconductor memory device 110 and output a first command CMD1 and a first address ADDR1 to the semiconductor memory device 110.

The memory controller 120 may control the semiconductor memory device 110 under the control of an external host device (not illustrated). The memory controller 120 may exchange second data DATA2 with the host device and receive a second command CMD2 and a second address ADDR2 from the host device.

In an embodiment, the memory controller 120 may exchange first data DATA1 with the semiconductor memory device 110 on a first basis and exchange second data DATA2 with the host device on a second basis different from the first basis.

In an embodiment, the memory controller 120 may exchange first data DATA1 with the semiconductor memory device 110 according to a first format and transmit a first command CMD1 and a first address ADDR1 to the semiconductor memory device 110. The memory controller 120 may exchange second data DATA2 with the host device according to a second format different from the first format and receive a second command CMD2 and a second address ADDR2 from the host device.

The memory controller 120 may use the RAM 130 as a buffer memory, a cache memory, or a working memory. For example, the memory controller 120 may receive second data DATA2 from the host device, store the received second data DATA2 in the RAM 130, and write the second data DATA2, stored in the RAM 130, in the semiconductor memory device 110 as first data DATA1. For example, the memory controller 120 may receive second data DATA2 from the host device, store the received second data DATA2 in the RAM 130, and write the second data DATA2, stored in the RAM 130, in the semiconductor memory device 110 as first data DATA1. The memory controller 120 may store, in the RAM 130, data read from the semiconductor memory device 110, and write the data, stored in the RAM 130, in the semiconductor memory device 110 again.

The memory controller 120 may store, in the RAM 130, data or code required for managing the semiconductor memory device 110. For example, the memory controller 120 may read, from the semiconductor memory device 110, data or code required for managing the semiconductor memory device 110, and may load the data or code on the RAM 130.

The RAM 130 may include at least one of various random access memories such as a dynamic RAM (DRAM), a static RAM (SRAM), a synchronous DRAM (SDRAM), a phase-change RAM (PRAM), a magnetic RAM (MRAM), a resistive RAM (RRAM), and a ferroelectric RAM (FeRAM).

The storage device 100 may perform a data write, read, or erase operation in response to a request of the host device. The storage device may include a solid state drive (SSD) or a hard disk drive (HDD). The storage device 100 may include memory cards such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), a universal serial bus (USB) memory card, and a universal flash storage (UFS). The storage device 100 may include a mounted memory such as an embedded multimedia card (eMMC), a universal flash storage (UFS) memory, or a perfect page new (PPN) memory.

Figure 2:
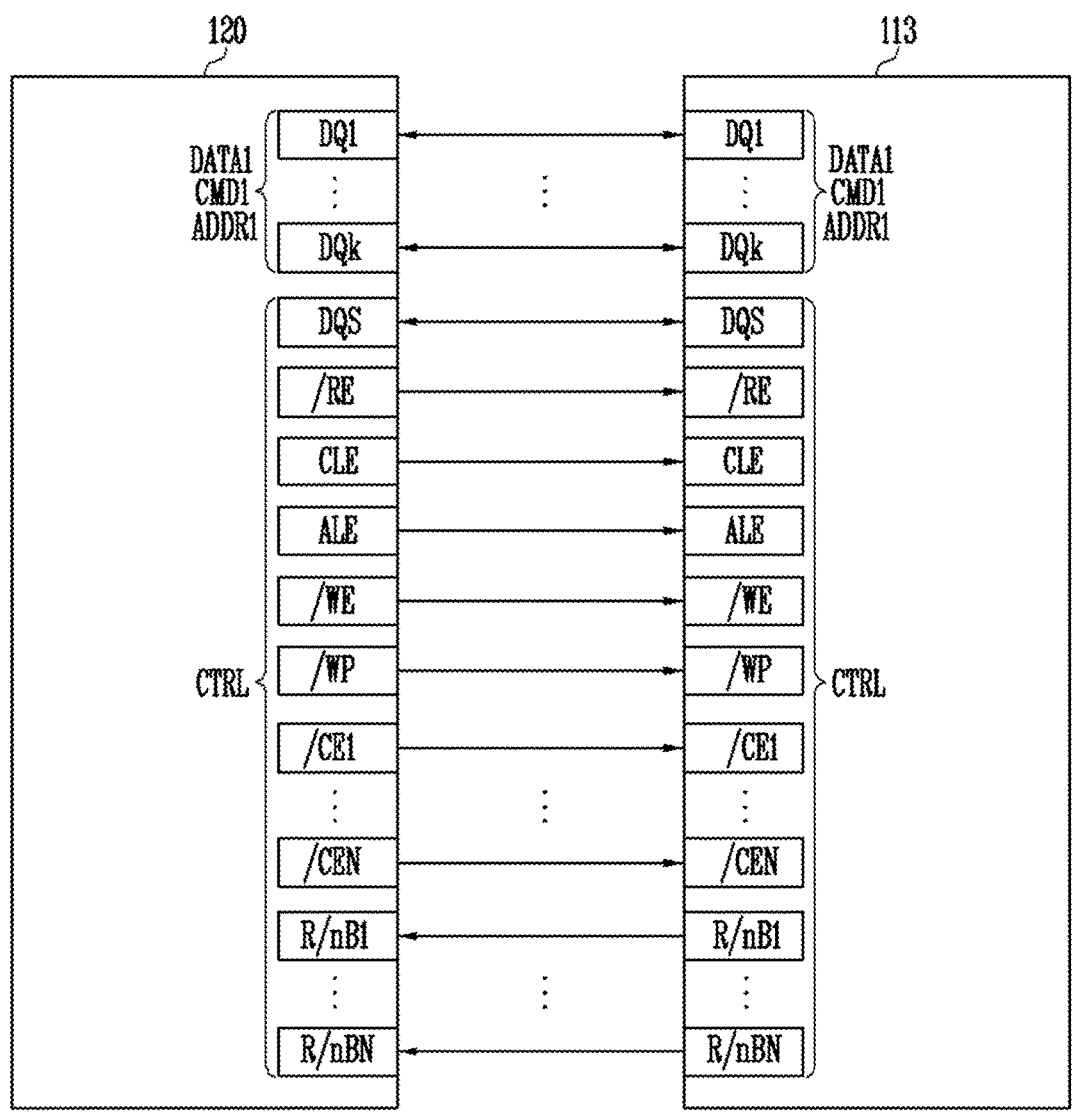
FIG. 2 is a block diagram illustrating a relationship between a memory controller and an interface chip.

FIG. 2 is a block diagram illustrating relationship between a memory controller 120 and an interface chip 113.

Referring to FIG. 2, the memory controller 120 and the interface chip 113 may exchange first data DATA1, a first command CMD1, and a first address ADDR1 with each other through a common channel. Each of the memory controller 120 and the interface chip 113 may include first to k-th input/output pads DQ1 to DQk. The memory controller 120 and the interface chip 113 may exchange the first data DATA1, the first command CMD1, and the first address ADDR1 with each other through the first to k-th input/output pads DQ1 to DQk. For example, depending on the form of a control signal CTRL, a signal to be transmitted through the first to k-th input/output pads DQ1 to DQk may be determined as any one of the first data DATA1, the first command CMD1, or the first address ADDR1. For example, the first to k-th input/output pads DQ1 to DQk (i.e., DQ[K:1]) may be eight, sixteen, or thirty-two, but the number of input/output pads is not limited thereto.

The memory controller 120 and the interface chip 113 may exchange control signals CTRL with each other. Each of the memory controller 120 and the interface chip 113 may include a plurality of pads configured to respectively exchange the data strobe signal DQS, the read enable signal /RE, the command latch enable signal CLE, the address latch enable signal ALE, the write enable signal /WE, the write protection signal /WP, the first to N-th chip enable signals /CE1 to /CEN, and the first to N-th ready/busy signals R/nB1 to R/nBN.

For example, when the memory controller 120 enables one of the chip enable signals /CE1 to /CEN (e.g., to a logic low level), enables the command latch enable signal CLE (e.g., to a logic high level), disables the address latch enable signal ALE (e.g., to a logic low level), enables the write enable signal /WE (e.g., to a logic low level), and then disables the write enable signal /WE (e.g., to a logic high level), the memory controller 120 may output a first command CMD1 through the first to k-th input/output pads DQ1 to DQk. The interface chip 113 or the memory unit 111 may determine that the first command CMD1 is received through the first to k-th input/output pads DQ1 to DQk.

For example, when the memory controller 120 enables one of the chip enable signals /CE1 to /CEN (e.g., to a logic low level), disables the command latch enable signal CLE (e.g., to a logic low level), enables the address latch enable signal ALE (e.g., to a logic high level), enables the write enable signal /WE (e.g., to a logic low level), and then disables the write enable signal /WE (e.g., to a logic high level), the memory controller 120 may output a first address ADDR1 through the first to k-th input/output pads DQ1 to DQk. The interface chip 113 or the memory unit 111 may determine that the first address ADDR1 is received through the first to k-th input/output pads DQ1 to DQk.

For example, if the memory controller 120 enables one of the chip enable signals /CE1 to /CEN (e.g., to a logic low level), disables the command latch enable signal CLE (e.g., to a logic low level), disables the address latch enable signal ALE (e.g., to a logic low level), disables the write enable signal /WE (e.g., to a logic high level), and disables the read enable signal /RE (e.g., to a logic high level), the memory controller 120 may generate a data strobe signal DQS which periodically toggles, and output first data DATA1 through the first to k-th input/output pads DQ1 to DQk in synchronization with the data strobe signal DQS. The interface chip 113 or the memory unit 111 may determine that the first data DATA1 is received through the first to k-th input/output pads DQ1 to DQk in synchronization with the data strobe signal DQS.

For example, the memory controller 120 may enable one of the chip enable signals /CE1 to /CEN (e.g., to a logic low level), disable the command latch enable signal CLE (e.g., to a logic low level, disable the address latch enable signal ALE (e.g., to a logic low level), disable the write enable signal /WE (e.g., to a logic high level), and periodically toggle the read enable signal /RE. The interface chip 113 or the memory unit 111 may generate a data strobe signal DQS, which periodically toggles, from the read enable signal /RE that periodically toggles. The interface chip 113 or the memory unit 111 may output first data DATA1 through the first to k-th input/output pads DQ1 to DQk in synchronization with the data strobe signal DQS. The memory controller 120 may determine that the first data DATA1 is received through the first to k-th input/output pads DQ1 to DQk in synchronization with the data strobe signal DQS.

Figure 3:
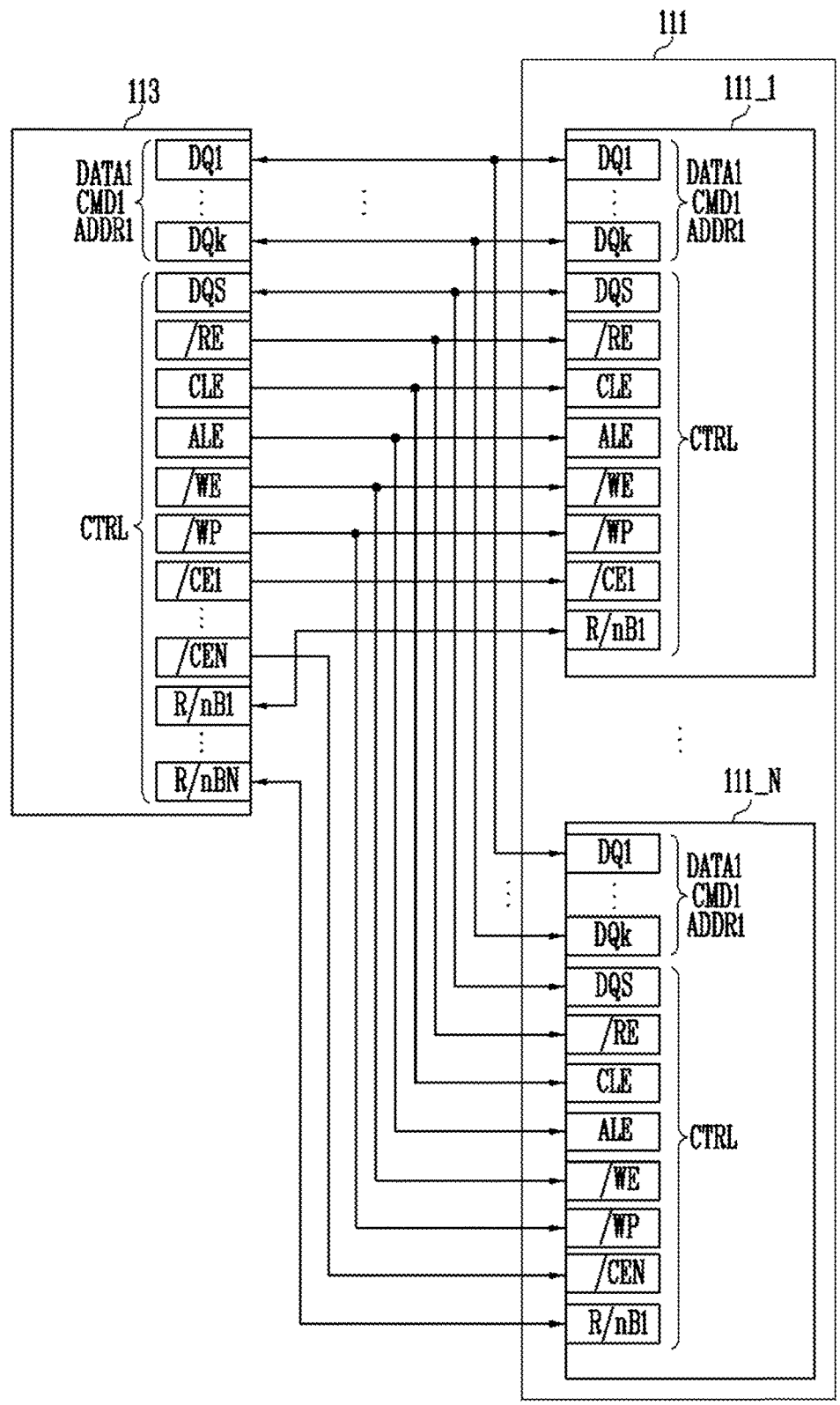
FIG. 3 is a block diagram illustrating relationship between the interface chip and a memory unit.

FIG. 3 is a block diagram illustrating relationship between the interface chip 113 and the memory unit 111.

Referring to FIG. 3, the memory unit 111 may include a plurality of memory chips 111_1 to 111_N. For instance, each of the memory chips 111_1 to 111_N may be formed of a single semiconductor chip.

The interface chip 113 and each of the memory chips 111_1 to 111_N may include first to k-th input/output pads DQ1 to DQk. The first to k-th input/output pads DQ1 to DQk of the memory chips 111_1 to 111_N may be respectively coupled in common to the first to k-th input/output pads DQ1 to DQk of the interface chip 113. The interface chip 113 and the memory chips 111_1 to 111_N may exchange first data DATA1, a first command CMD1, and a first address ADDR1 with each other through the first to k-th input/output pads DQ1 to DQk. For example, depending on the form of a control signal CTRL, a signal to be transmitted through the first to k-th input/output pads DQ1 to DQk may be determined as the first data DATA1, the first command CMD1, or the first address ADDR1. For example, the first to k-th input/output pads DQ1 to DQk may be eight, sixteen, or thirty-two, but the number of input/output pads is not limited thereto.

The interface chip 113 and the memory chips 111_1 to 111_N may exchange a control signal CTRL with each other. The interface chip 113 may include a plurality of pads configured to respectively exchange the data strobe signal DQS, the read enable signal /RE, the command latch enable signal CLE, the address latch enable signal ALE, the write enable signal /WE, the write protection signal /WP, the first to N-th chip enable signals /CE1 to /CEN, and the first to N-th ready/busy signals R/nB1 to R/nBN.

Each of the memory chips 111_1 to 111_N may include a plurality of pads configured to respectively exchange the data strobe signal DQS, the read enable signal /RE, the command latch enable signal CLE, the address latch enable signal ALE, the write enable signal /WE, the write protection signal /WP, one of the first to N-th chip enable signals /CE1 to /CEN, and one of the first to N-th ready/busy signals R/nB1 to R/nBN.

The memory chips 111_1 to 111_N may respectively exchange the data strobe signal DQS, the read enable signal /RE, the command latch enable signal CLE, the address latch enable signal ALE, the write enable signal /WE, and the write protection signal /WP with the interface chip 113 through the common channel.

Each of the memory chips 111_1 to 111_N may receive one chip enable signal from the interface chip 113 and output one ready/busy signal to the interface chip 113. The memory chips 111_1 to 111_N may respectively receive the chip enable signals /CE1 to CEN from different pads of the interface chip 113. The memory chips 111_1 to 111_N may respectively transmit the ready/busy signals R/nB1 to R/nBN to different pads of the interface chip 113.

As described with reference to FIGS. 2 and 3, the interface chip 113 may mediate communication between the memory controller 120 and the memory chips 111_1 to 111_N. The interface chip 113 may rearrange first data DATA1 received from the memory controller 120 and transmit the rearranged first data DATA1 to the memory chips 111_1 to 111_N. The interface chip 113 may rearrange first data DATA1 received from the memory chips 111_1 to 111_N and transmit the rearranged first data DATA1 to the memory controller 120. The interface chip 113 may perform a retiming operation in a shadow form during a communication operation between the memory controller 120 and the memory chips 111_1 to 111_N. Therefore, the interface chip 113 may enhance the reliability of the storage device 100 without reducing the operating speed of the storage device 100.

Figure 4:
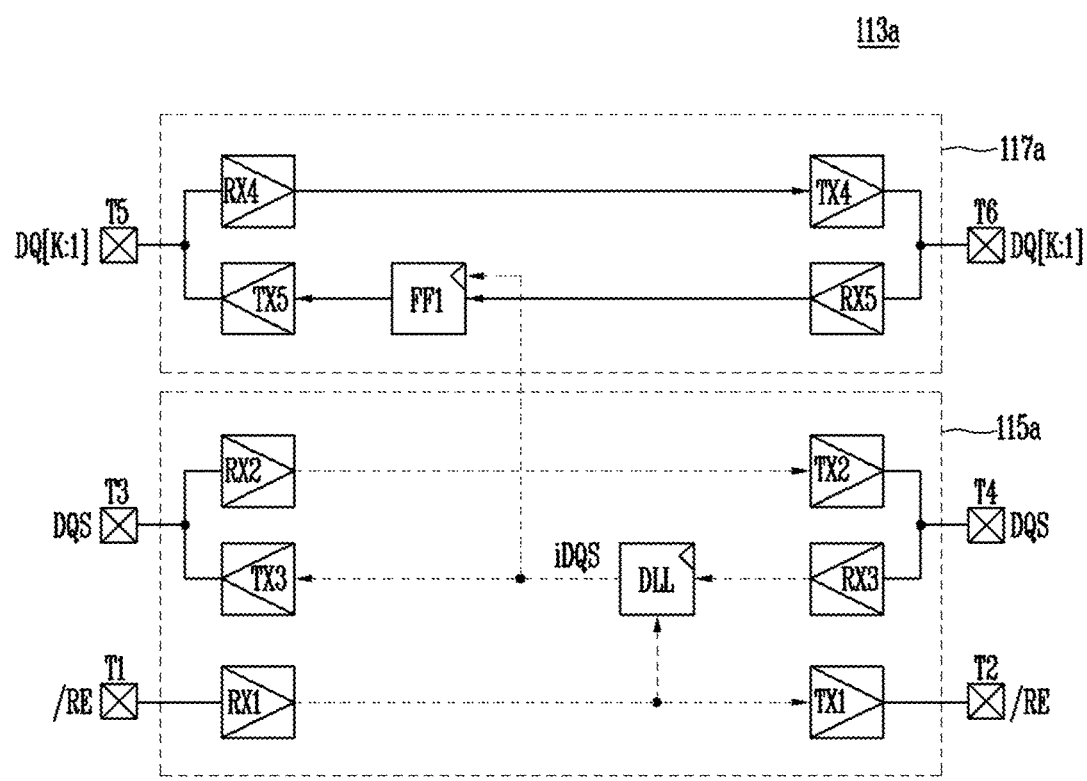
FIG. 4 is a diagram illustrating an operation of an interface chip during a read operation.

FIG. 4 is a diagram illustrating an operation of an interface chip 113a during a read operation.

Referring to FIG. 4, the interface chip 113a may include a timing signal processing unit 115a and a data retiming unit 117a.

The timing signal processing unit 115a may receive a read enable signal /RE from the memory controller 120 through a first terminal T1. The first terminal T1 may correspond to the pad of the interface chip 113 that is used to receive a read enable signal /RE, as illustrated in FIG. 2. The timing signal processing unit 115a may output a read enable signal /RE to the memory unit 111 through a second terminal T2. The second terminal T2 may correspond to the pad of the interface chip 113 that is used to output a read enable signal /RE, as illustrated in FIG. 3.

The timing signal processing unit 115a may exchange a data strobe signal DQS with the memory controller 120 through a third terminal T3. The third terminal T3 may correspond to the pad of the interface chip 113 that is used to exchange a data strobe signal DQS, as illustrated in FIG.

2. The timing signal processing unit 115a may exchange a data strobe signal DQS with the memory unit 111 through a fourth terminal T4. The fourth terminal T4 may correspond to the pad of the interface chip 113 that is used to exchange a data strobe signal DQS, as illustrated in FIG. 3.

The timing signal processing unit 115a may include first to third receiving nodes RX1 to RX3, first to third transmitting nodes TX1 to TX3, and a delay-locked loop DLL.

The first receiving node RX1 may receive a read enable signal /RE through the first terminal T1. The read enable signal /RE received through the first receiving node RX1 may be transmitted to the second terminal T2 through the first transmitting node TX1. For example, during a read operation of the semiconductor memory device 110, a read enable signal /RE may be transmitted from the first terminal T1 to the second terminal T2 through the first receiving node RX1 and the first transmitting node TX1.

The second receiving node RX2 may receive a data strobe signal DQS through the third terminal T3. The data strobe signal DQS received through the third receiving node RX3 may be transmitted to the fourth terminal T4 through the second transmitting node TX2. For example, during a write operation, a data strobe signal DQS may be transmitted from the third terminal T3 to the fourth terminal T4 through the second receiving node RX2 and the second transmitting node TX2.

In an embodiment, the third receiving node RX3 may receive a data strobe signal DQS through the fourth terminal T4. For example, during a read operation, a data strobe signal DQS received through the third receiving node RX3 may be transmitted to the delay-locked loop DLL.

The delay-locked loop DLL may receive a read enable signal /RE through the first receiving node RX1 and receive a data strobe signal DQS through the third receiving node RX3. The delay-locked loop DLL may detect a locking delay in synchronization with the read enable signal /RE. The delay-locked loop DLL may generate, as an internal signal iDQS, a signal delayed by the detected locking delay rather than a data strobe signal DQS received through the third receiving node RX3. The internal signal iDQS may be transmitted to the third terminal T3 through the third transmitting node TX3 as a data strobe signal DQS to be transmitted to the memory controller 120. Furthermore, the internal signal iDQS may be transmitted to the data retiming unit 117a.

The data retiming unit 117a may receive a first address ADDR1 or a first command CMD1 from the memory controller 120 through a fifth terminal T5. The data retiming unit 117a may exchange first data DATA1 with the memory controller 120 through the fifth terminal T5. The fifth terminal T5 may correspond to the first to k-th input/output pads DQ1 to DQk of the interface chip 113 illustrated in FIG. 2. The data retiming unit 117a may output a first address ADDR1 or a first command CMD1 to the memory unit 111 through a sixth terminal T6. The data retiming unit 117a may exchange first data DATA1 with the memory unit 111 through a sixth terminal T6. The sixth terminal T6 may correspond to the first to k-th input/output pads DQ1 to DQk of the interface chip 113 illustrated in FIG. 3. For the sake of explanation, embodiments of the present disclosure will be described with reference to first data DATA1 to be exchanged through the fifth and sixth terminals T5 and T6. Descriptions on the first address ADDR1 and the first command CMD1 to be transmitted through the fifth and sixth terminals T5 and T6 will be omitted.

The data retiming unit 117a may include fourth and fifth receiving nodes RX4 and RX5, fourth and fifth transmitting nodes TX4 and TX5, and a first flip-flop FF1.

The fourth receiving node RX4 may receive first data DATA1 through the fifth terminal T5. The first data DATA1 received through the fourth receiving node RX4 may be transmitted to the sixth terminal T6 through the fourth transmitting node TX4. For example, during a write operation, the first data DATA1 may be transmitted from the fifth terminal T5 to the sixth terminal T6 through the fourth receiving node RX4 and the fourth transmitting node TX4.

The fifth receiving node RX5 may receive first data DATA1 through the sixth terminal T6. The first data DATA1 received through the fifth receiving node RX5 may be transmitted to the first flip-flop FF1. The first flip-flop FF1 may receive the first data DATA1 from the fifth receiving node RX5 and receive the internal signal iDQS from the timing signal processing unit 115a. The first flip-flop FF1 may latch (or store) and output the first data DATA1 received through the fifth receiving node RX5, in synchronization with the internal signal iDQS. In other words, the first flip-flop FF1 may rearrange the first data DATA1 in synchronization with the internal signal iDQS. First data DATA1' rearranged by the first flip-flop FF1 may be transmitted to the fifth terminal T5 through the fifth transmitting node TX5.

As described above, the interface chip 113a may detect a locked phase from the read enable signal /RE during a read operation of the semiconductor memory device 110. The interface chip 113a may generate an internal signal iDQS from the data strobe signal DQS using the detected locked phase. The interface chip 113a may rearrange the first data DATA1 using the internal signal iDQS. The interface chip 113a may output the rearranged first data DATA1' and output the internal signal iDQS as a data strobe signal DQS.

A locking time may be required when the delay-locked loop DLL performs a phase locking operation. Using a locked phase detected from the read enable signal /RE, the interface chip 113a may generate the internal signal iDQS from the data strobe signal DQS received through the third receiving node RX3, without performing a delay locking operation. Since the delay locking operation is not performed with respect to the data strobe signal DQS received through the third receiving node RX3, the interface chip 113a may rearrange the first data DATA1 without affecting the operating performance (e.g., the speed) of the storage device 100.

With regard to FIG. 4, the interface chip 113a is described as pertaining to the first to k-th input/output pads DQ1 to DQk, the pads configured to transmit the data strobe signal DQS, and the pads configured to transmit the read enable signal /RE. Among the signals described as being transmitted through the interface chip 113 in FIGS. 2 and 3, signals other than the signals described with reference to FIG. 4 may pass through the interface chip 113a without a separate processing operation or an interaction operation.

Figure 5:
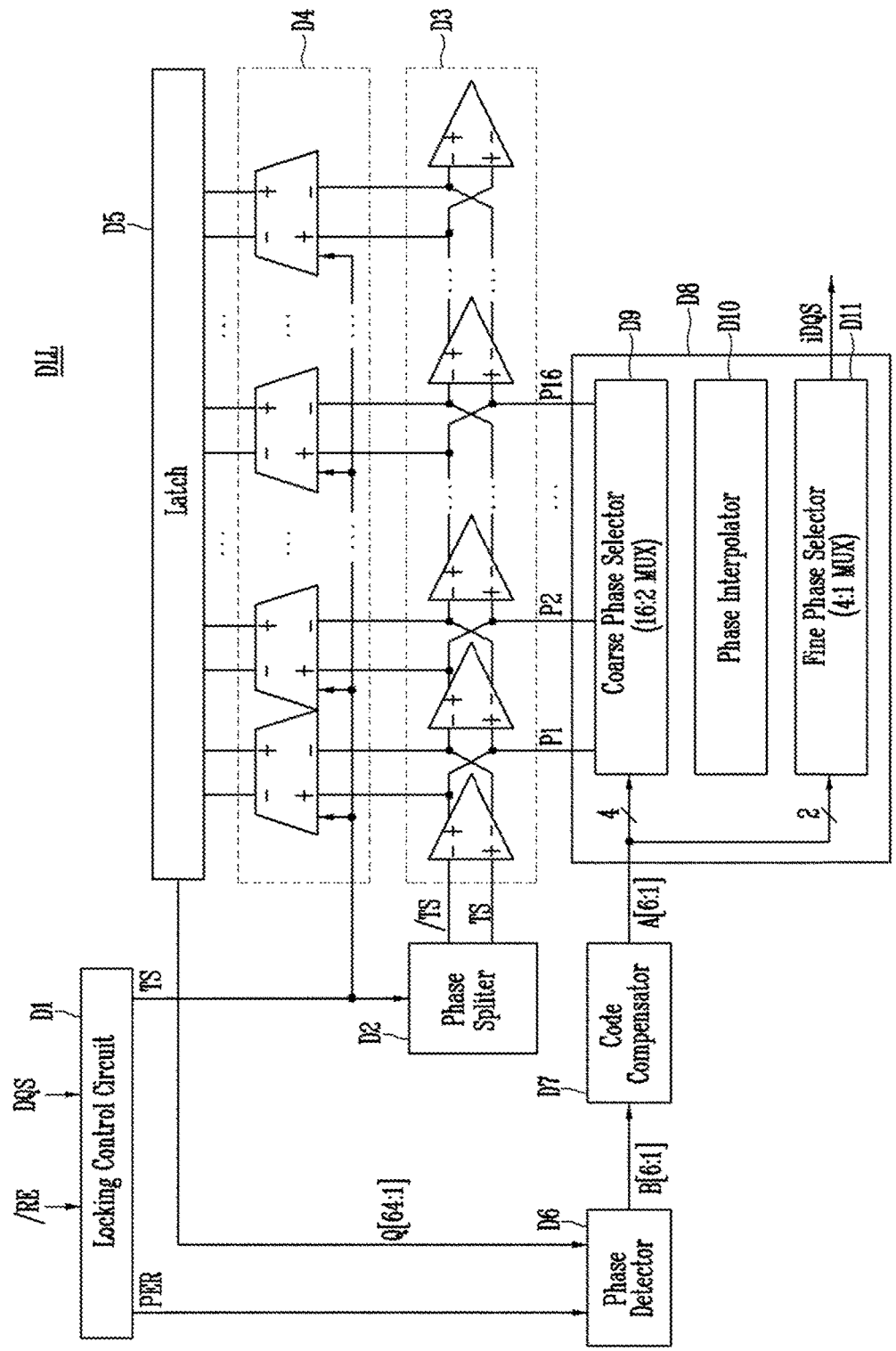
FIG. 5 is a diagram illustrating an operation of a delay-locked loop during a read operation.

FIG. 5 is a diagram illustrating an operation of a delay-locked loop DLL during a read operation.

Referring to FIGS. 4 and 5, the delay-locked loop DLL may include a locking control circuit D1, a phase splitter D2, a delay line D3, a sense line D4, a latch D5, a phase detector D6, a code compensator D7, and a phase selector D8.

The locking control circuit D1 may receive a read enable signal /RE from the first receiving node RX1 and receive a data strobe signal DQS from the third receiving node RX3. The locking control circuit D1 may store information about a phase locking period for which a phase locking operation is performed on the read enable signal /RE. The locking control circuit D1 may output either the inputted read enable signal /RE or data strobe signal DQS to the phase splitter D2 and the sense line D4 as a timing signal TS. For example, the locking control circuit D1 may output the read enable signal /RE as the timing signal TS during the phase locking period. The locking control circuit D1 may output the data strobe signal DQS as the timing signal TS during a period other than the phase locking period. The locking control circuit D1 may enable a control signal PER during the phase locking period. The locking control circuit D1 may disable the control signal PER during a period other than the phase locking period. For example, the phase locking period may include at least one initial period of the read enable signal /RE.

The phase splitter D2 may receive a timing signal TS from the locking control circuit D1. The phase splitter D2 may generate an inverted timing signal /TS from the timing signal TS. The phase splitter D2 may output the timing signal TS and the inverted timing signal /TS to the delay line D3.

The delay line D3 may include a plurality of delayers. Each delayer may be an inverter which inverts a received signal and outputs the inverted signal. A first delayer may receive a timing signal TS and an inverted timing signal /TS. The first delayer may invert and output the timing signal TS and the inverted timing signal /TS. A k-th delayer may receive complementary signals from a k−1-th delayer. The k-th delayer may invert and output each of the received complementary signals.

For example, the delay line D3 may delay the timing signal TS and the inverted timing signal /TS sixty-four times. In other words, the delay line D3 may include at least sixty-four delayers. The number of delayers of the delay line D3 may be variously changed or modified rather than being limited. Furthermore, the delayers of the delay line D3 may be changed or modified to delay and output only one signal rather than complementary signals.

The sense line D4 may include a plurality of sensors. Each sensor may sense output signals of a corresponding delayer of the delay line D3 in synchronization with the timing signal TS. Each sensor may invert and output complementary signals received from the corresponding delayer. Complementary output signals of each sensor of the sense line D4 or positive signals (or negative signals) of the complementary output signals may be stored in the latch D5. In the case where the delay line D3 is configured to delay the timing signal TS and the inverted timing signal /TS sixty-four times, the sense line D4 may include sixty-four sensors. The latch D5 may store sixty-four sensing results Q[64:1].

The number of sensors of the sensing line D4 may be variously changed or modified rather than being limited. Furthermore, the sensors of the sense line D4 may be changed or modified to sense and output only one signal rather than complementary signals.

The phase detector D6 may receive a control signal PER from the locking control circuit D1 and receive a sensing result Q[64:1] from the latch D5. The phase detector D6 may extract a code B[6:1] from the sensing result Q[64:1] while the control signal PER is enabled. For example, the phase detector D6 may detect a position corresponding to one period of the timing signal TS from the sensing result Q[64:1].

For instance, when a positive signal of each delayer of the delay line D3 is '1', a positive signal of a corresponding sensor of the sensing line D4 may be '1'. When the positive signal of each delayer of the delay line D3 is '0', the positive signal of a corresponding sensor of the sensing line D4 may be '0'. The sensing result Q[64:1] corresponding to positive signals of sensors of the sensing line D4 may be formed of '1' and '0'. The sensing result Q[64:1] may sequentially have a value of '1' and then have a value of '0'. In addition, the sensing result Q[64:1] may sequentially have a value of '0' and then have a value of '1'. The value of the sensing result Q[64:1] may be changed at a position at which the timing signal TS makes a transition. In other words, the phase detector D6 may detect a position corresponding to one period of the timing signal TS, that is, a position on the sensors of the sensing line D4, by monitoring a variation in values of the sensing result Q[64:1].

The phase detector D6 may further detect a position corresponding to a quarter period from the detected position corresponding to the one period. The phase detector D6 may store information about the position corresponding to the quarter period, as a code B[6:1]. For example, while the control signal PER is an enabled state, the phase detector D6 may not output the code B[6:1]. After the control signal PER is disabled, the phase detector D6 may output the code B[6:1] to the code compensator D7.

The code compensator D7 may receive the code B[6:1] from the phase detector D6. The code compensator D7 may reflect subsidiary delays required for input, output, and processing of the delay-locked loop DLL and compensate for the code B[6:1]. The code compensator D7 may output a compensated code A[6:1] to the phase selector D8.

The phase selector D8 may select one of outputs P1 to P16 of the delay line D3 based on the compensated code A[6:1]. The selected output may be outputted as an internal signal iDQS.

In the foregoing embodiment, the phase detector D6 has been described as detecting a quarter period of the timing signal TS and generate the code B[6:1]. In the case where the delay line D3 delays the timing signal TS and the inverted timing signal /TS sixty-four times, one period of the timing signal TS may be detected at sixty-four delay points (e.g., sixty-four sensors). A quarter period of the timing signal TS may be detected at sixteen (a quarter of sixty-four) delay points (e.g., sixteen sensors). Hence, the phase selector D8 may select a signal, which is delayed by a quarter period from the timing signal TS, by selecting one of the first to sixteenth outputs P1 to P16 of the delay line D3.

In an embodiment, the phase selector D8 may include a coarse phase selector D9, a phase interpolator D10, and a fine phase selector D11. The coarse phase selector D9 may select two outputs from the first to sixteenth outputs P1 to P16, based on four bits of the compensated code A[6:1]. For example, the coarse phase selector D9 may select two outputs closest to a quarter period of the timing signal TS.

The phase interpolator D10 may perform phase interpolation on output signals of the coarse phase selector D9 and output four signals.

The fine phase selector D11 may select one of four output signals of the phase interpolator D10 as an internal signal iDQS, based on the remaining two bits of the compensated code A[6:1].

The detailed configuration of the delay-locked loop DLL has been described with reference to FIG. 5, but this is only one example of the delay-locked loop DLL, and the configuration of the delay-locked loop DLL included in the interface chip 113 is not limited to that illustrated in FIG. 5. The configuration of the delay-locked loop DLL may be variously changed or modified without departing from the spirit and scope of the present disclosure.

Figure 6:
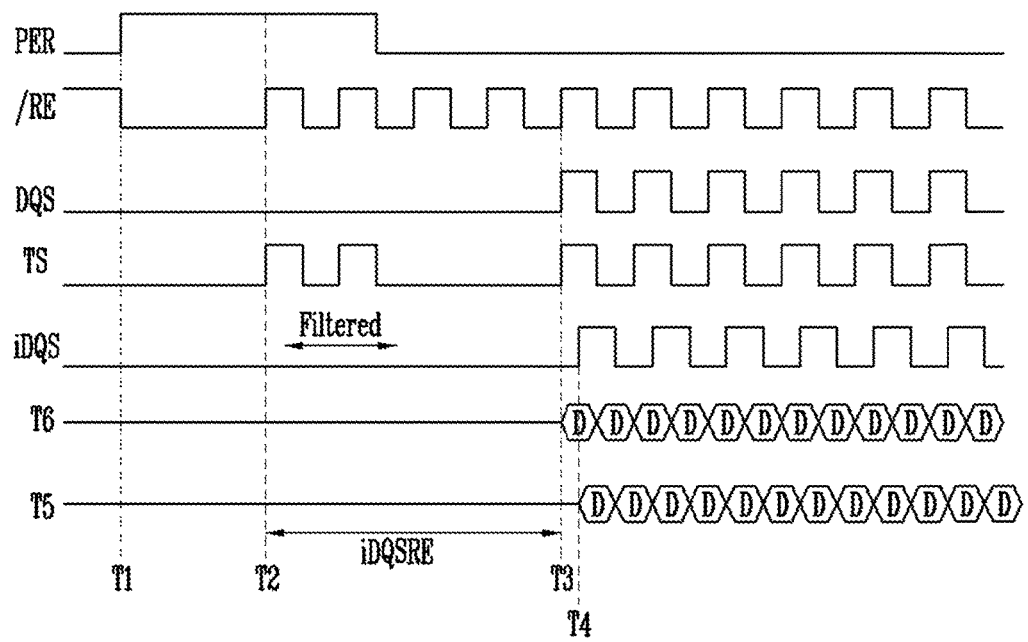
FIG. 6 is a timing diagram for describing signals to be inputted to and outputted from the interface chip of FIG. 5.

FIG. 6 is a timing diagram for describing signals to be inputted to and outputted from the interface chip 113a of FIG. 5. Illustrated in FIG. 6 are signals to be inputted to or outputted from the interface chip 113a during a read operation of the semiconductor memory device 110.

Referring to FIGS. 1, 5 and 6, a read enable signal /RE may be enabled at a first time T1. For example, the memory controller 120 may enable the read enable signal /RE when performing a read operation on the semiconductor memory device 110. When the read enable signal /RE is enabled, a control signal PER may also be enabled at the first time T1.

After having been enabled, the read enable signal /RE may begin to periodically toggle at a second time T2. For example, the read enable signal /RE may periodically make a transition from the second time T2 at which a read preamble time tRPRE has passed after the read enable signal /RE has been enabled.

The control signal PER may be disabled after a time (or a phase) corresponding to 1.5 times a period has passed after the read enable signal /RE has begun to periodically toggle. For example, the control signal PER may be maintained in the enabled state until the read enable signal /RE toggles two times (or makes four transitions).

The read enable signal /RE may be outputted as a timing signal TS while the control signal PER is enabled. Therefore, while the control signal PER is enabled, the waveform of the timing signal TS may toggle (or make transitions) over 1.5 times a period in the same manner as that of the read enable signal /RE. While the timing signal TS toggles (or makes transitions) according to the read enable signal /RE, the phase detector D6 of the delay-locked loop DLL may detect a locking delay corresponding to a quarter period of the timing signal TS.

While the control signal PER is enabled, that is, while the delay-locked loop DLL detects a locking delay, the interface chip 113a may output no signal. For example, while the control signal PER is enabled, the phase detector D6 may not output a code B[6:1]. Hence, even when the timing signal TS toggles (or makes a transition), the internal signal iDQS may be maintained in the disabled state.

When a predetermined time tDQSRE has passed after the read enable signal /RE has begun to periodically toggle (or make a transition), a data strobe signal DQS may begin to periodically toggle (or make a transition) at a third time T3. For example, the memory unit 111 may receive, through the second terminal T2 of the interface chip 113a, the read enable signal /RE that periodically toggles (or make a transition) from the second time T2. The memory unit 111 may transmit, to the fourth terminal T4 of the interface chip 113a, the data strobe signal DQS that periodically makes a transition, based on the read enable signal /RE that periodically toggles.

The data strobe signal DQS may have the same period or frequency as that of the read enable signal /RE. The memory unit 111 may begin to toggle the data strobe signal DQS when the predetermined time tDQSRE has passed after the read enable signal /RE has begun to periodically toggle.

If the data strobe signal DQS beings to toggle, the delay-locked loop DLL may generate an internal signal iDQS from the data strobe signal DQS, based on the locking delay detected from the read enable signal /RE. The phase detector D6 may generate the internal signal iDQS from the data strobe signal DQS, based on a quarter-period locking delay detected from the read enable signal /RE.

Since the control signal PER is in a disabled state, the data strobe signal DQS may be provided as a timing signal TS. Because the control signal PER is in a disabled state, the phase detector D6 may output, as the internal signal iDQS, a signal generated by delaying the data strobe signal DQS by the quarter-period locking delay.

The memory unit 111 may transmit first data DATA1 to the sixth terminal T6 of the interface chip 113a at the same time when the data strobe signal DQS begins to toggle.

The first flip-flop FF1 of the data retiming unit 117a may store and output the first data DATA1 received through the sixth terminal T6 in synchronization with the internal signal iDQS. The internal signal iDQS may be a signal which is generated by delaying the data strobe signal DQS by the quarter-period locking delay. Therefore, the first flip-flop FF1 may store and output, at the optimal timing, the first data DATA1 received through the sixth terminal T6 in synchronization with the internal signal iDQS.

First data DATA1' rearranged by the first flip-flop FF1 may be synchronized with the internal signal iDQS. The interface chip 113a may output the internal signal iDQS through the third terminal T3, as the data strobe signal DQS synchronized with the rearranged first data DATA1'.

In accordance with the embodiment described with reference to FIGS. 4 to 6, the interface chip 113a may detect a locking delay during a delay time tDQSRE between the read enable signal /RE and the data strobe signal DQS. In other words, an operation in which the interface chip 113a detects the locking delay may be shadowed by normal operations of the storage device 100 while it is performed, without requiring a separate time. Furthermore, since the internal signal iDQS is generated from the data strobe signal DQS using a pre-detected locking delay, only a quarter-period delay that is the pre-detected locking delay may be needed without a separate time taken to generate the internal signal iDQS. Hence, the interface chip 113a may rearrange the first data DATA1 without hindering the operating performance (or the operating speed) of the storage device 100, whereby the reliability of the storage device 100 may be enhanced.

Figure 7:
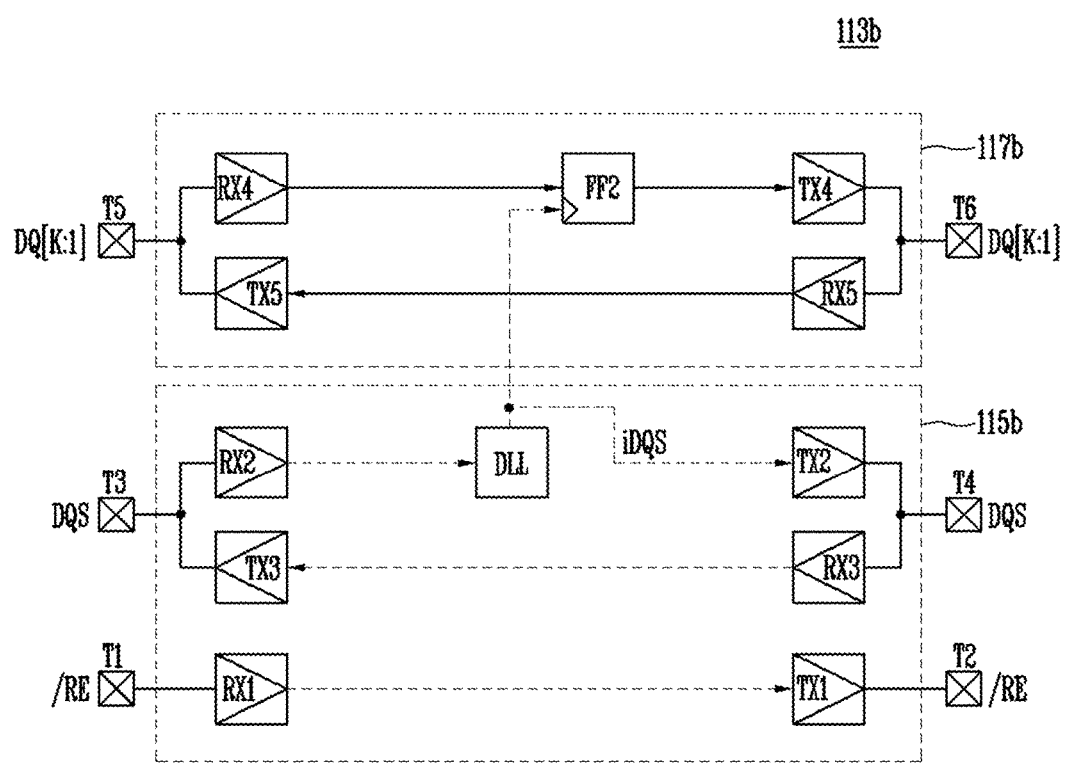
FIG. 7 is a diagram illustrating an operation of an interface chip during a write operation.

FIG. 7 is a diagram illustrating an operation of an interface chip 113b during a write operation.

Referring to FIG. 7, the interface chip 113b may include a timing signal processing unit 115b and a data retiming unit 117b.

In the timing signal processing unit 115b, a data strobe signal DQS received through a fourth terminal T4 and a third receiving node RX3 may be transmitted to a third transmitting node TX3 and a third terminal T3. The data strobe signal DQS received through the third terminal T3 and a second receiving node RX2 may be transmitted to a delay-locked loop DLL.

The delay-locked loop DLL may receive the data strobe signal DQS which is received through the second receiving node RX2.

The delay-locked loop DLL may detect a locking delay from the data strobe signal DQS and generate an internal signal iDQS from the data strobe signal DQS using the detected locking delay. The delay-locked loop DLL may output, as the internal signal iDQS, a signal which is delayed from the data strobe signal DQS by a quarter period of the data strobe signal DQS. The internal signal iDQS outputted from the delay-locked loop DLL may be transmitted to the fourth terminal T4 through a second transmitting node TX2. Also, the internal signal iDQS may be transmitted to the data retiming unit 117b.

In the data retiming unit 117b, first data DATA1 received through a sixth terminal T6 and a fifth receiving node RX5 may be transmitted to a fifth terminal T5 through a fifth transmitting node TX5. The first data DATA1 received through the fifth terminal T5 and a fourth receiving node RX4 may be transmitted to a second flip-flop FF2. The second flip-flop FF2 may store and output the first data DATA1 in synchronization with the internal signal iDQS received from the timing signal processing unit 115b. In other words, the second flip-flop FF2 may rearrange the first data DATA1. First data DATA1' rearranged by the second flip-flop FF2 may be transmitted to the sixth terminal T6 through the fourth transmitting node TX4.

Figure 8:
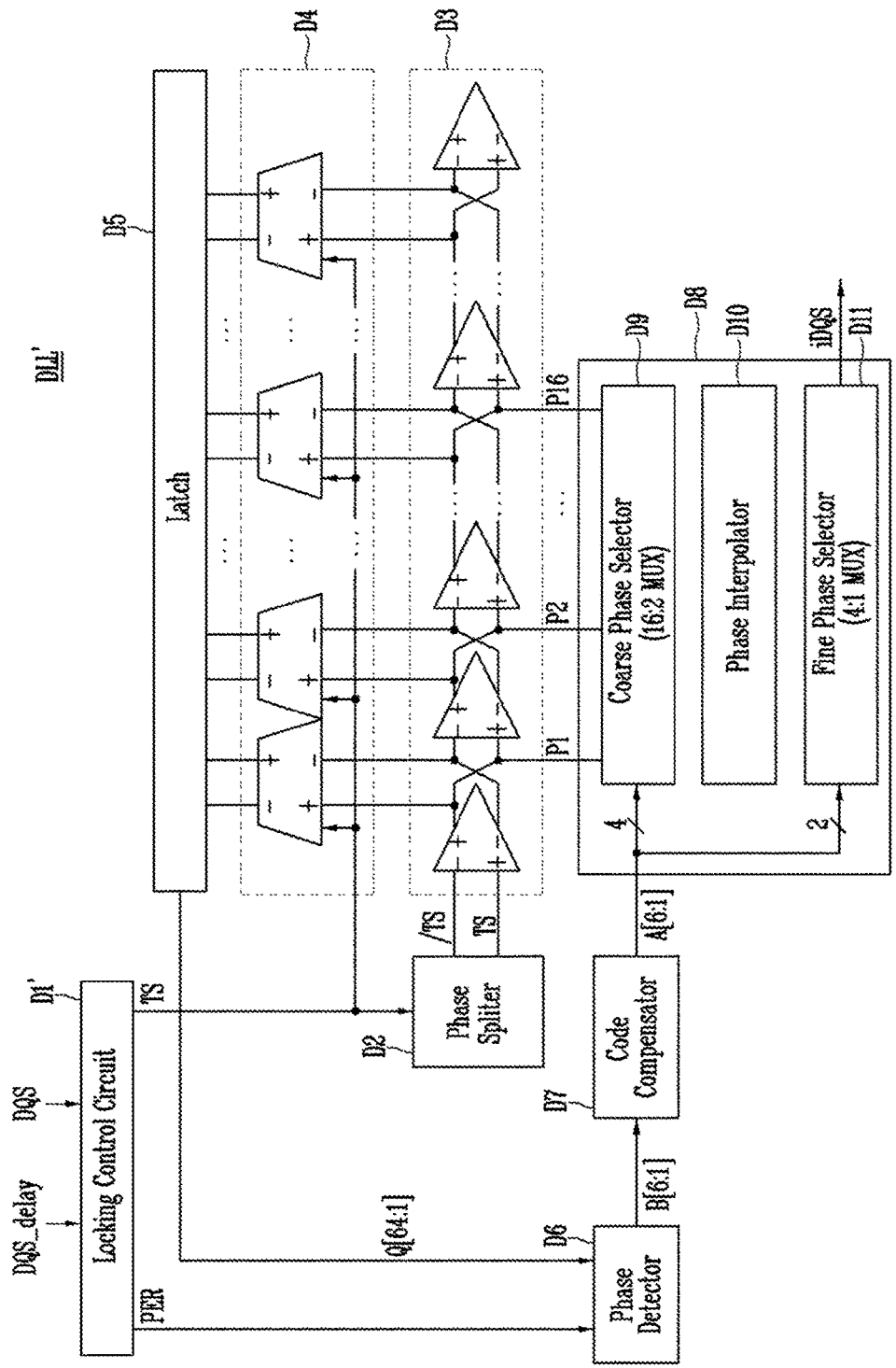
FIG. 8 is a diagram illustrating an operation of a delay-locked loop during a write operation.

FIG. 8 is a diagram illustrating an operation of a delay-locked loop DLL' during a write operation.

Referring to FIGS. 7 and 8, the delay-locked loop DLL' may include a locking control circuit D1', a phase splitter D2, a delay line D3, a sense line D4, a latch D5, a phase detector D6, a code compensator D7, and a phase selector D8.

Unlike the delay-locked loop DLL of FIG. 5, the locking control circuit D1' may receive a data strobe signal DQS from the second receiving node RX2. The locking control circuit D1' may output the data strobe signal DQS as a timing signal TS regardless of the control signal PER. The locking control circuit D1' may be maintained in an enabled state during two periods of the data strobe signal DQS and then may be disabled.

Figure 9:
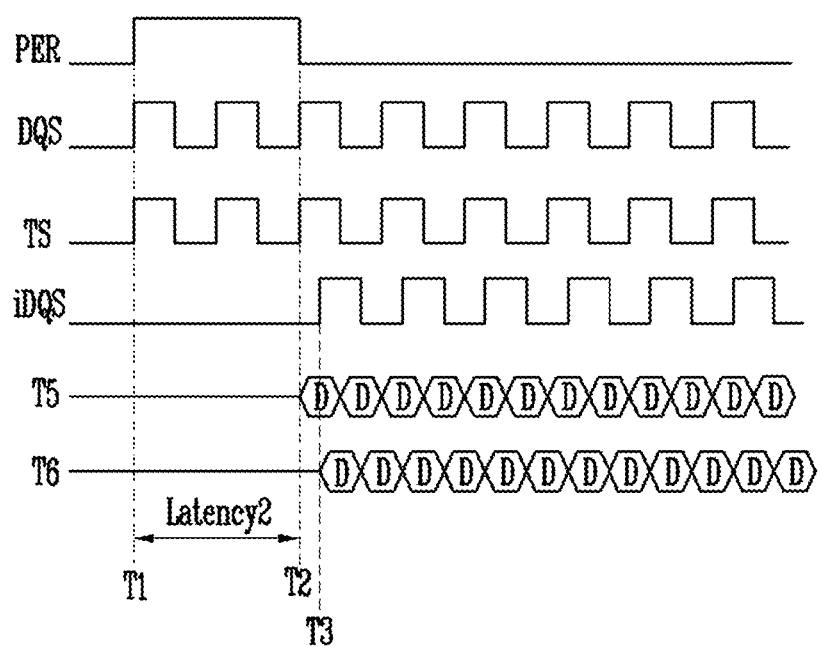
FIG. 9 is a timing diagram illustrating signals to be inputted to and outputted from the interface chip.

FIG. 9 is a timing diagram illustrating signals to be inputted to and outputted from the interface chip 113b. Illustrated in FIG. 9 are signals to be inputted to or outputted from the interface chip 113b during a write operation of the semiconductor memory device 110.

Referring to FIGS. 1 and 7 to 9, a data strobe signal DQS may begin to periodically toggle (or make a transition) at a first time T1. For example, the memory controller 120 may periodically toggle the data strobe signal DQS when performing a write operation on the semiconductor memory device 110. As the data strobe signal DQS periodically toggles, a control signal PER may also be enabled at the first time T1.

The control signal PER may be disabled after a time (or a phase) corresponding to two periods has passed after the data strobe signal DQS has begun to periodically toggle. For example, the control signal PER may be maintained in the enabled state until the data strobe signal DQS toggles two times (or make four transitions).

The data strobe signal DQS may be provided as a timing signal TS regardless of whether the control signal PER is enabled. Therefore, the timing signal TS may have the same waveform as that of the data strobe signal DQS.

The phase detector D6 of the delay-locked loop DLL may detect a locking delay corresponding to a quarter period of the timing signal TS while the control signal PER is enabled.

While the control signal PER is enabled, that is, while the delay-locked loop DLL detects a locking delay, the interface chip 113b may output no signal. For example, while the control signal PER is enabled, the phase detector D6 may not output a code B[6:1]. Hence, even when the timing signal TS toggles (or makes a transition), the internal signal iDQS may be maintained in the disabled state.

After the control signal PER has been disabled, the phase detector D6 may output a code B[6:1] at a second time T2. Hence, the delay-locked loop DLL may output an internal signal iDQS which is delayed from the data strobe signal DQS by a quarter period.

In an embodiment, the memory controller 120 may control the data strobe signal DQS according to "Latency2" defined in the standard of a toggle NAND flash memory. With the "Latency2", the memory controller 120 may toggle the data strobe signal DQS during two periods and thereafter transmit first data DATA1 synchronized with the data strobe signal DQS. Therefore, after the data strobe signal DQS toggles during two periods, the memory controller 120 may transmit, at the second time, the first data DATA1 synchronized with the data strobe signal DQS to the fifth terminal T5.

The second flip-flop FF2 of the data retiming unit 117b may store and output the first data DATA1 received through the fifth terminal T5 in synchronization with the internal signal iDQS. The internal signal iDQS may be a signal which is generated by delaying the data strobe signal DQS by the locking delay corresponding to the quarter period. Therefore, the second flip-flop FF2 may store and output, at the optimal timing, the first data DATA1 received through the fifth terminal T5 in synchronization with the internal signal iDQS.

First data DATA1' rearranged by the second flip-flop FF2 may be synchronized with the internal signal iDQS. The interface chip 113b may output the internal signal iDQS through the fourth terminal T4, as the data strobe signal DQS synchronized with the rearranged first data DATA 1'.

In accordance with the embodiments described with reference to FIGS. 7 to 9, the interface chip 113b may detect a locking delay during a dummy toggle period of the data strobe signal DQS that is defined by "Latency2". In other words, an operation in which the interface chip 113b detects the locking delay may be shadowed by normal operations of the storage device 100 while it is performed, without requiring a separate time. Furthermore, since the internal signal iDQS is generated from the data strobe signal DQS using a pre-detected locking delay, only a quarter-period delay that is the pre-detected locking delay may be needed without a separate time taken to generate the internal signal iDQS. Hence, the interface chip 113b may rearrange the first data DATA1 without hindering the operating performance (or the operating speed) of the storage device 100, whereby the reliability of the storage device 100 may be enhanced.

"Latency2" defined in the standard of the NAND flash memory may be an option which is selected by a user and used to input/output a clear signal in such a way that, when an original signal begins to toggle, if the toggle does not fully swing or is not stable, the signal is delayed (using a latency) so that a clear signal can be inputted or outputted. However, in accordance with the embodiments described with reference to FIGS. 7 to 9, time is needed to detect a locking delay which is a timing required to delay a data strobe signal DQS inputted from the memory controller 120 to generate the data strobe signal DQS to be outputted from the interface chip 113b to the memory unit 111. Therefore, in the embodiments of FIGS. 7 to 9, the data strobe signal DQS is inputted during two periods to detect the locking delay, so that time corresponding to this is essentially needed. Thus, "Latency2" defined in the standard of the NAND flash memory may be an item which is necessarily required for the operation, rather than being optionally selected by the user.

In an embodiment of the present disclosure, according to "Latency2" the memory controller 120 may secure the time corresponding to two periods of the data strobe signal DQS using a delay circuit without outputting data after the two periods of the data strobe signal DQS. Therefore, the user may optionally select whether the memory controller 120 performs a "Latency2" operation.

Figure 10:
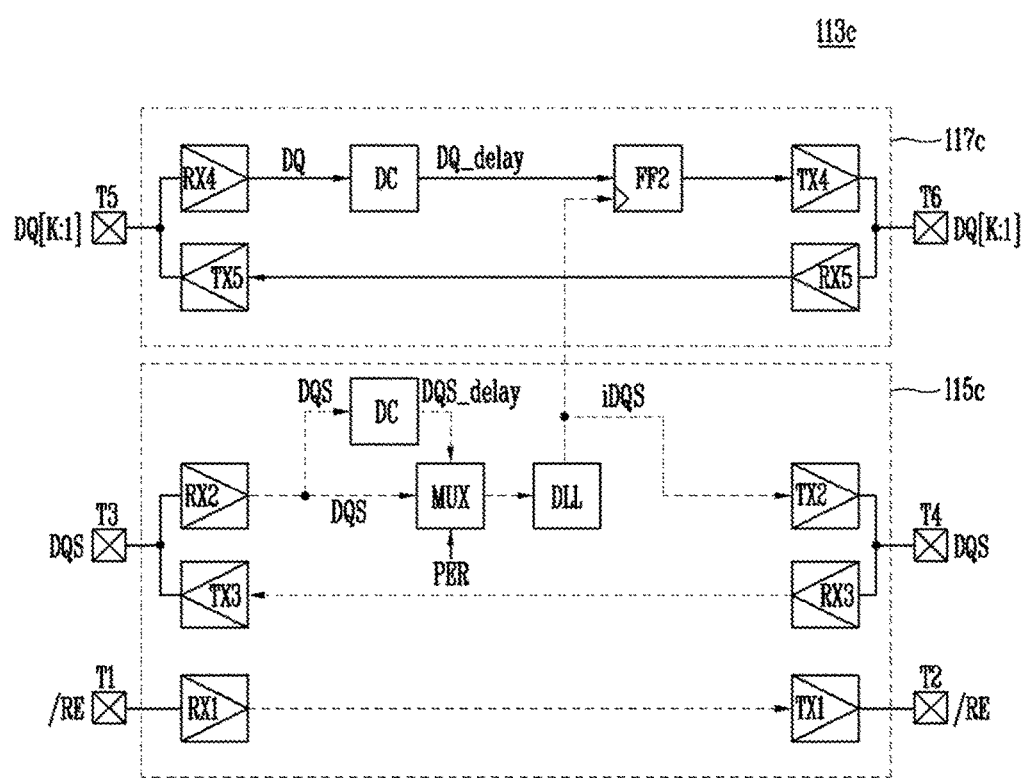
FIG. 10 is a diagram illustrating an interface chip in accordance with an embodiment of the present disclosure.

FIG. 10 is a diagram illustrating an interface chip 113c in accordance with an embodiment of the present disclosure.

The operation of the interface chip 113c in accordance with the embodiments of FIG. 10 may be performed during a write operation of the storage device 100.

Referring to FIG. 10, the interface chip 113c may include a timing signal processing unit 115c and a data retiming unit 117c.

In the timing signal processing unit 115c, a data strobe signal DQS received through a fourth terminal T4 and a third receiving node RX3 may be transmitted to a third transmitting node TX3 and a third terminal T3. In the timing signal processing unit 115c, a data strobe signal DQS received through the third terminal T3 and a second receiving node RX2 may be inputted to a multiplexer MUX and a delay circuit DC.

The delay circuit DC may receive a data strobe signal DQS via the third terminal T3 and the second receiving node RX2. The delay circuit DC may output a delayed data strobe signal DQS_delay generated by delaying the inputted data strobe signal DQS by at least two periods or more. In an embodiment, any delay circuit may be used as the delay circuit DC, so long as it may perform a function of outputting a delayed data strobe signal DQS_delay generated by delaying a data strobe signal DQS by at least two periods or more. In other words, the configuration of the delay circuit DC included in the interface chip 113c may be variously changed or modified without departing from the spirit and scope of the present disclosure.

The multiplexer MUX may receive a data strobe signal DQS from the second receiving node RX2. Furthermore, the multiplexer MUX may receive a delayed data strobe signal DQS_delay from the delay circuit DC. The multiplexer MUX may receive a control signal PER. The multiplexer MUX may output either the data strobe signal DQS or the delayed data strobe signal DQS_delay to the delay-locked loop DLL according to the control signal PER. In an embodiment, the control signal PER may be the same signal as the control signal PER described with reference to FIGS. 5 and 8. Although not illustrated, the control signal PER may be implemented using a D-flip-flop DFF. For example, the control signal PER may be generated to be enabled ("low" to "high") at a first rising edge of a data strobe signal DQS or a write enable signal /WE and to be disabled ("high" to "low") at a third rising edge thereof.

The delay-locked loop DLL may receive the data strobe signal DQS or the delayed data strobe signal DQS_delay received through the multiplexer MUX. The delay-locked loop DLL may detect a locking delay from the data strobe signal DQS and generate an internal signal iDQS from the delayed data strobe signal DQS_delay using the detected locking delay. The delay-locked loop DLL may output the delayed data strobe signal DQS_delay as the internal signal iDQS. The internal signal iDQS outputted from the delay-locked loop DLL may be transmitted to the fourth terminal T4 through a second transmitting node TX2. Also, the internal signal iDQS may be transmitted to the data retiming unit 117c.

The operation of the delay-locked loop DLL in accordance with an embodiment of FIG. 10 may be the same as the operation of the delay-locked loop DLL' described with reference to FIG. 8. In other words, the locking control circuit D1' of the delay-locked loop DLL' may receive either the data strobe signal DQS or the delayed data strobe signal DQS_delay from the multiplexer MUX according to the control signal PER. For example, the locking control circuit D1' may receive a data strobe signal DQS from the multiplexer MUX while the control signal PER is enabled. The locking control circuit D1' may output the data strobe signal DQS as a timing signal TS while the control signal PER is enabled. The locking control circuit D1' may be maintained in an enabled state during two periods of the data strobe signal DQS and then may be disabled.

When the control signal PER is disabled, the locking control circuit D1' may receive a delayed data strobe signal DQS_delay. For example, the locking control circuit D1' may receive the delayed data strobe signal DQS_delay from the multiplexer MUX when the control signal PER is disabled. The locking control circuit D1' may output the delayed data strobe signal DQS_delay as the timing signal TS when the control signal PER is disabled. Consequentially, after the control signal PER is disabled, the delayed data strobe signal DQS_delay may be outputted as an internal signal iDQS.

The data retiming unit 117c may include fourth and fifth receiving nodes RX4 and RX5, fourth and fifth transmitting nodes TX4 and TX5, a second flip-flop FF2, and a delay circuit DC.

First data DATA1 received through a sixth terminal T6 and the fifth receiving node RX5 may be transmitted to the fifth terminal T5 through the fifth transmitting node TX5.

The fourth receiving node RX4 may receive first data DATA1 through the fifth terminal T5. The first data received through the fourth receiving node RX4 may be inputted to the delay circuit DC. The delay circuit DC included in the data retiming unit 117c may be embodied by the same circuit as the delay circuit DC included in the timing signal processing unit 115c. In an embodiment, the delay circuit DC included in the retiming unit 117c may output delayed first data DQ_delay generated by delaying the first data received through the fourth receiving node RX4 by a time or phase by which the delay circuit DC included in the timing signal processing unit 115c delays the data strobe signal DQS.

The delayed first data dQ_delay outputted from the delay circuit DC may be transmitted to the second flip-flop FF2. The second flip-flop FF2 may store and output the delayed first data DQ_delay in synchronization with the internal signal iDQS received from the timing signal processing unit 115c. In other words, the second flip-flop FF2 may rearrange the delayed first data DQ_delay. Data rearranged by the second flip-flop FF2 may be transmitted to the sixth terminal T6 through the fourth transmitting node TX4.

Figure 11:
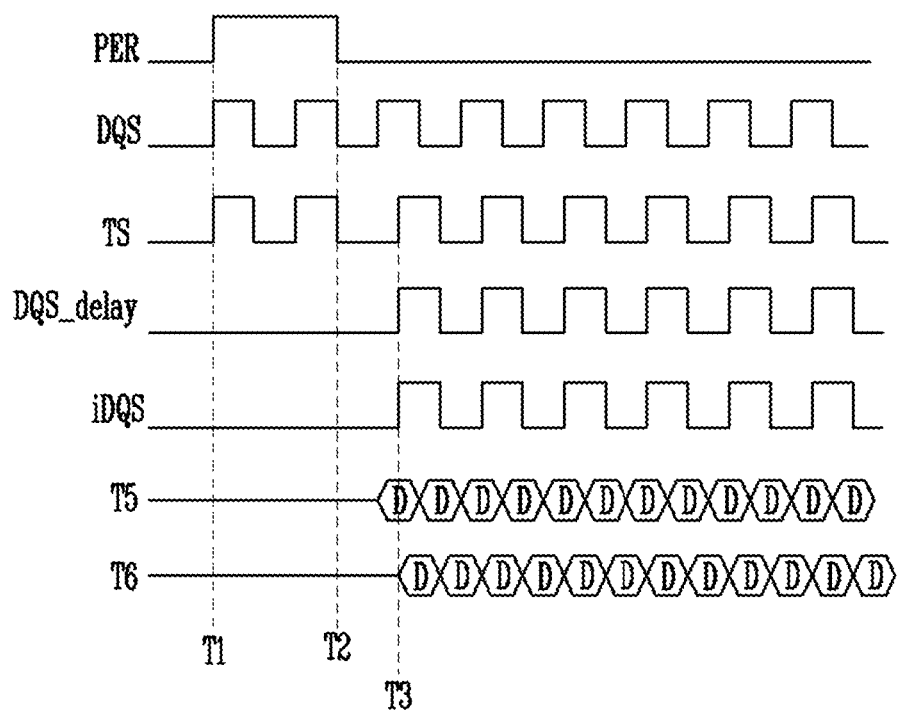
FIG. 11 is a timing diagram for describing signals to be inputted to and outputted from the interface chip of FIG. 10.

FIG. 11 is a timing diagram illustrating signals to be inputted to and outputted from the interface chip 113c of FIG. 10.

Illustrated in FIG. 11 are signals to be inputted to or outputted from the interface chip 113c during a write operation of the semiconductor memory device 110.

Referring to FIGS. 1 to 3, 10 and 11, a data strobe signal DQS may begin to periodically toggle (or make a transition) at a first time T1. For example, the memory controller 120 may periodically toggle the data strobe signal DQS when performing a write operation on the semiconductor memory device 110. As the data strobe signal DQS periodically toggles, a control signal PER may also be enabled at the first time T1.

In an embodiment, the control signal PER may be disabled after a time (or a phase) corresponding to at least one period has passed after the data strobe signal DQS has begun to periodically toggle. For example, the control signal PER may be maintained in the enabled state until the data strobe signal DQS toggles three times. The control signal PER may be disabled at a second time T2 which is after a time (or a phase) corresponding to at least one period has passed after the data strobe signal DQS has begun to periodically toggle. In various embodiments, although not illustrated, the control signal PER may be enabled or disabled according to a write enable signal /WE outputted from the memory controller 120.

While the control signal PER is enabled, the multiplexer MUX may output a data strobe signal DQS as a timing signal of the delay-locked loop DLL. Therefore, while the control signal PER is enabled, the waveform of the timing signal TS may toggle (or make transitions) over two periods in the same manner as that of the data strobe signal DQS. While the timing signal TS toggles (or makes transitions) according to the data strobe signal DQS, the phase detector D6 of the delay-locked loop DLL may detect a locking delay corresponding to a quarter period of the timing signal TS.

While the control signal PER is enabled, that is, while the delay-locked loop DLL detects a locking delay, the interface chip 113a may output no signal. For example, while the control signal PER is enabled, the phase detector D6 may not output a code B[6:1]. Hence, even when the timing signal TS toggles (or makes a transition), the internal signal iDQS may be maintained in a disabled state.

When a predetermined time (at least one period) has passed after the data strobe signal DQS has begun to toggle (or make a transition), the multiplexer MUX may output a delayed data strobe signal DQS_delay as the timing signal TS. In other words, the multiplexer MUX may output the delayed data strobe signal DQS_delay as the timing signal TS when the control signal PER is disabled. Consequentially, after the control signal PER is disabled, the delayed data strobe signal DQS_delay may be outputted as an internal signal iDQS.

The first data DATA1 received through the fifth terminal T5 and the fourth receiving node RX4 may be transmitted as delayed first data DQ_delay by the delay circuit DC. Thereafter, the delayed first data DQ_delay may be transmitted to the second flip-flop FF2. The second flip-flop FF2 may store and output the first data DATA1 in synchronization with the internal signal iDQS received from the timing signal processing unit 115c. In other words, the second flip-flop FF2 may rearrange the first data DATA1. First data DATA1' rearranged by the second flip-flop FF2 may be transmitted to the sixth terminal T6 through the fourth transmitting node TX4. Hence, data to be outputted to the sixth terminal T6 may be synchronized with each other at a third time and then outputted to the memory unit 111 because the data are outputted according to the internal signal iDQS having the same phase as that of the delayed data strobe signal DQS_delay.

In an embodiment of FIGS. 7 to 9, when the delay-locked loop DLL performs a phase locking operation, a locking time is required. Thus, the delay-locked loop DLL detects a locking delay during a dummy toggle period of the data strobe signal DQS defined by "Latency2". However, the embodiments illustrated in FIGS. 10 and 11 may be provided with the delay circuit DC, which delays, by the same phase or time, both the data strobe signal DQS to be inputted and the first data DATA1 to be inputted from the memory controller 120 to the fifth terminal T5. Thus, the interface chip 113c may rearrange the first data DATA1 without affecting the operating performance (e.g., the speed) of the storage device 100. Consequentially, the user may selectively use, as an option, "Latency2" defined in the standard of the NAND flash memory.

In an embodiment, among the signals described as being transmitted through the interface chip 113 in FIGS. 2 and 3, signals other than the signals described with reference to FIG. 10 may pass through the interface chip 113c without a separate processing operation or an interaction operation.

Figure 12:
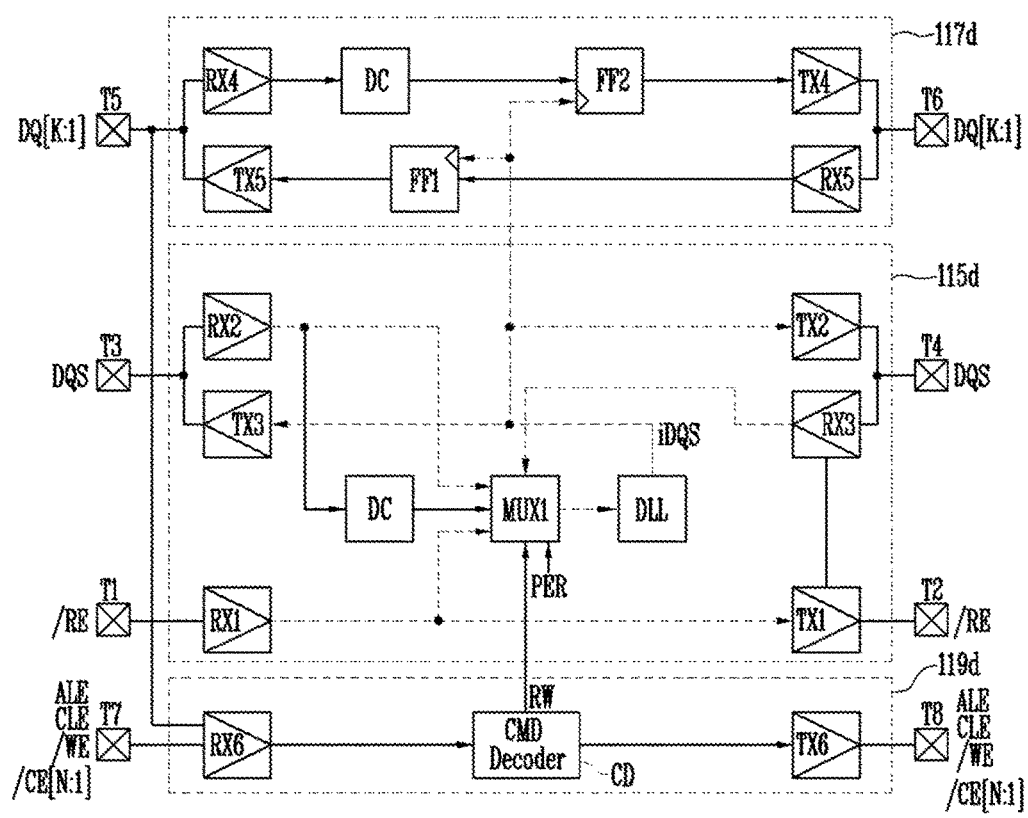
FIG. 12 illustrates an interface chip in accordance with other embodiments of the present disclosure.

FIG. 12 illustrates an interface chip 113d in accordance with a second embodiment of the present disclosure.

Referring to FIG. 12, the interface chip 113d may include a timing signal processing unit 115d, a data retiming unit 117d, and a command recognition unit 119d.

Compared to the interface chip 113c of FIG. 10, the interface chip 113d may further include the command recognition unit 119d. The command recognition unit 119d may receive an address latch enable signal ALE, a command latch enable signal CLE, a write enable signal /WE, and first to N-th chip enable signals /CE1 to /CEN (i.e., CE[N:1]) from the memory controller 120 through a seventh terminal T7. The seventh terminal T7 may correspond to the pads of the interface chip 113 that are illustrated in FIG. 2 and configured to respectively receive the address latch enable signal ALE, the command latch enable signal CLE, the write enable signal /WE, and the first to N-th chip enable signals /CE1 to /CEN. The command recognition unit 119d may receive first data DATA1 through a fifth terminal T5.

The command recognition unit 119d may output the address latch enable signal ALE, the command latch enable signal CLE, the write enable signal /WE, and the first to N-th chip enable signals /CE1 to /CEN to the memory unit 111 through an eighth terminal T8. The eighth terminal T8 may correspond to the pads of the interface chip 113 that are illustrated in FIG. 3 and configured to respectively output the address latch enable signal ALE, the command latch enable signal CLE, the write enable signal /WE, and the first to N-th chip enable signals /CE1 to /CEN.

The command recognition unit 119d may include a sixth receiving node RX6, a sixth transmitting node TX6, and a command decoder CD.

The sixth receiving node RX6 may receive the address latch enable signal ALE, the command latch enable signal CLE, the write enable signal /WE, and the first to N-th chip enable signals /CE1 to /CEN from the seventh terminal T7. The address latch enable signal ALE, the command latch enable signal CLE, the write enable signal /WE, and the first to N-th chip enable signals /CE1 to /CEN that are received through the sixth receiving node RX6 may be transmitted to the command decoder CD.

The command decoder CD may determine whether a signal received from the fifth terminal T5 is a first command CMD1, based on the address latch enable signal ALE, the command latch enable signal CLE, the write enable signal /WE, and the first to N-th chip enable signals /CE1 to /CEN that are received from the seventh terminal T7. For example, when the memory controller 120 enables one of the chip enable signals /CE1 to /CEN (e.g., to a logic low level), enables the command latch enable signal CLE (e.g., to a logic high level), disables the address latch enable signal ALE (e.g., to a logic low level), enables the write enable signal /WE (e.g., to a logic low level), and then disables the write enable signal /WE (e.g., to a logic high level), the interface chip 113 may recognize that the first command CMD1 is received through the fifth terminal T5.

When the first command CMD1 is received through the fifth terminal T5, the command decoder CD may determine whether the received first command CMD1 is a read command or a write command. The command decoder CD may control a control signal RW according to the determination result. For example, if the first command CMD1 is a read command, the command decoder CD may control the control signal RW to a first value. If the first command CMD1 is a write command, the command decoder CD may control the control signal RW to a second value. If the first command CMD1 is neither a read command nor a write command, the command decoder CD may disable the control signal RW. The control signal RW may be transmitted to the timing signal processing unit 115d.

The command decoder CD may transmit the address latch enable signal ALE, the command latch enable signal CLE, the write enable signal /WE, and the first to N-th chip enable signals /CE1 through /CEN to an eighth terminal T8 through a sixth transmitting node TX6.

A read enable signal /RE received through a first terminal T1 and a first receiving node RX1 may be transmitted to a first multiplexer MUX1. The read enable signal /RE may be transmitted to a second terminal T2 through a first transmitting node TX1.

A data strobe signal DQS received through the third terminal T3 and the second receiving node RX2 may be transmitted to a delay circuit DC and a first multiplexer MUX1. A data strobe signal DQS received through the fourth terminal T4 and the third receiving node RX3 may be transmitted to the first multiplexer MUX1.

The first multiplexer MUX1 may receive the read enable signal /RE from the first receiving node RX1, the data strobe signal DQS from the second receiving node RX2, a delayed data strobe signal DQS_delay from the delay circuit DC, the data strobe signal DQS from the third receiving node RX3, and the control signal RW from the command decoder CD. When the control signal RW indicates a read operation, the first multiplexer MUX1 may transmit the read enable signal /RE received from the first receiving node RX1, and the data strobe signal DQS received from the third receiving node RX3, to a delay-locked loop DLL. When the control signal RW indicates a write operation, the first multiplexer MUX1 may transmit, to the delay locked loop DLL, either the data strobe signal DQS received from the second receiving node RX2 or the delayed data strobe signal DQS_delay received from the delay circuit DC, according to a control signal PER.

The delay locked loop DLL may receive, during a read operation, the read enable signal /RE from the receiving node RX1, and the data strobe signal DQS from the third receiving node RX3. As described with reference to FIGS. 4 to 6, the delay locked loop DLL may detect a locking delay corresponding to a quarter period from the read enable signal /RE and may output an internal signal iDQS, which is delayed from the data strobe signal DQS by a quarter period, using the detected locking delay. The internal signal iDQS may be transmitted to the data retiming unit 117d and outputted as a data strobe signal DQS through a third transmitting node TX3 and a third terminal T3.

During a write operation, the delay-locked loop DLL may receive either the data strobe signal DQS received from the second receiving node RX2 or the delayed data strobe signal DQS_delay received from the delay circuit DC, according to a control signal PER.

As described with reference to FIGS. 10 and 11, when the control signal PER is disabled after the locking delay corresponding to a quarter period is detected from the data strobe signal DQS, the delay-locked loop DLL may output, as an internal signal iDQS, the delayed data strobe signal DQS_delay received from the delay circuit DC. The internal signal iDQS may be transmitted to the data retiming unit 117d and outputted as a data strobe signal DQS through a second transmitting node TX2 and the fourth terminal T4.

In the data retiming unit 117d, during a read operation, a first flip-flop FF1 may rearrange first data DATA1 received through a sixth terminal T6 and a fifth receiving node RX5, in synchronization with the internal signal iDQS, as described with reference to FIGS. 4 to 6. During a write operation, a second flip-flop FF2 may rearrange, in synchronization with the internal signal iDQS, delayed first data DQ_delay generated by delaying, using the delay circuit DC, the first data DATA1 received through the fifth terminal T5 and the fourth receiving node RX4, as described with reference to FIGS. 10 to 11. The rearranged data may be outputted through the sixth terminal T6 via a fourth transmitting node TX4.

As described above, the interface chip 113d may retime first data DATA1 to be exchanged between the memory controller 120 and the semiconductor memory device 110, during a read operation or a write operation. The retiming operation of the interface chip 113d may be shadowed by normal operations of the storage device 100 while it is performed, without requiring a separate time. Hence, the interface chip 113d may rearrange the first data DATA1 without hindering the operating performance (or the operating speed) of the storage device 100, whereby the reliability of the storage device 100 may be enhanced.

Figure 13:
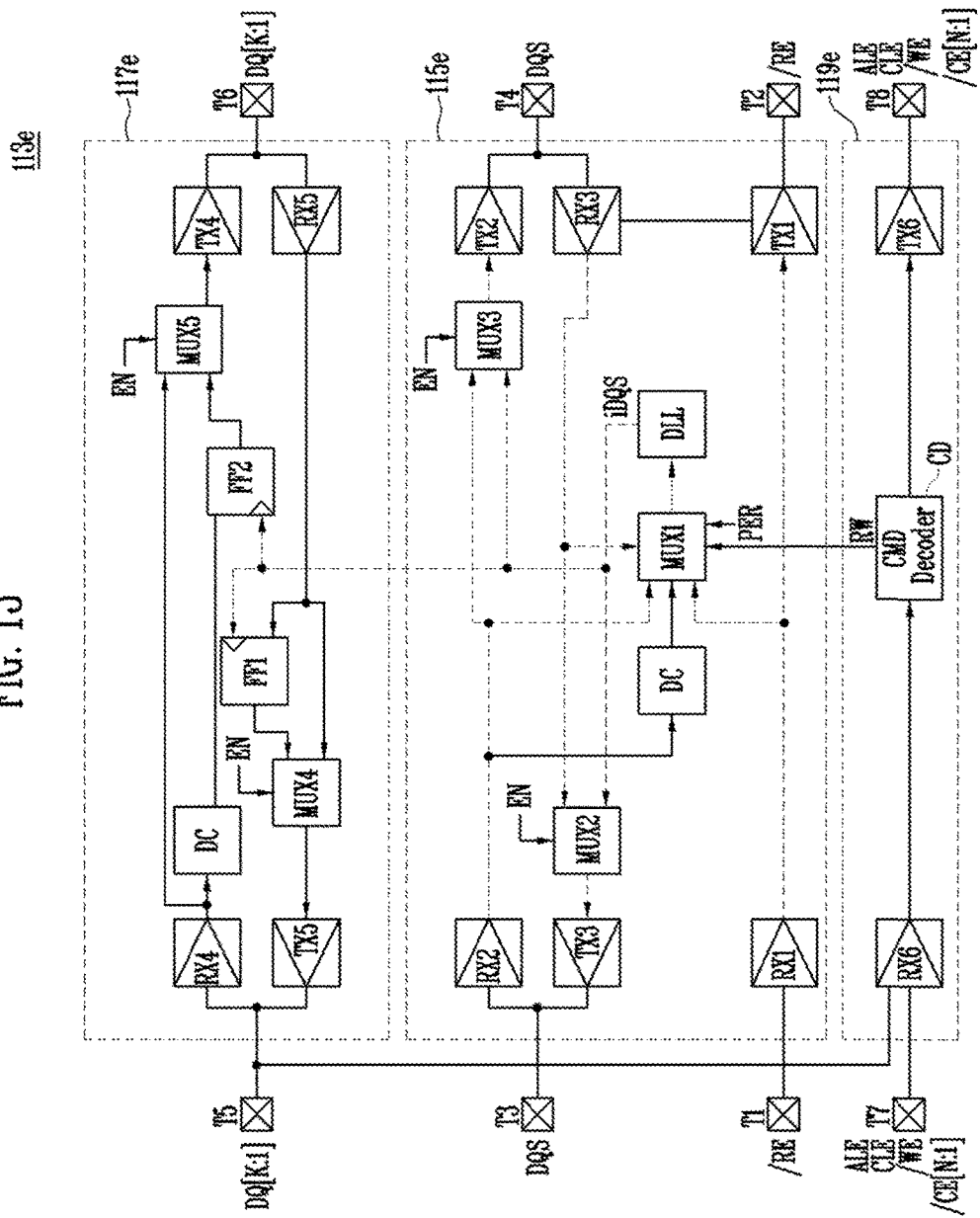
FIG. 13 illustrates an interface chip in accordance with other embodiments of the present disclosure.

FIG. 13 illustrates an interface chip 113e in accordance with other embodiments of the present disclosure.

Referring to FIG. 13, the interface chip 113e may include a timing signal processing unit 115e, a data retiming unit 117e, and a command recognition unit 119e. The interface chip 113e may selectively perform an operation of retiming first data DATA1.

Compared to the timing signal processing unit 115d of FIG. 12, the timing signal processing unit 115e may further include second and third multiplexers MUX2 and MUX3. The second multiplexer MUX2 may receive an internal signal iDQS from a delay-locked loop DLL, and receive a data strobe signal DQS through a fourth terminal T4 and a third receiving node RX3. In response to an enable signal EN, the second multiplexer MUX2 may transmit the internal signal iDQS or the data strobe signal DQS to a third transmitting node TX3.

The third multiplexer MUX3 may receive the internal signal iDQS from the delay-locked loop DLL, and receive a data strobe signal DQS through a third terminal T3 and a second receiving node RX2. In response to an enable signal EN, the third multiplexer MUX3 may transmit the internal signal iDQS or the data strobe signal DQS to a second transmitting node TX2.

Compared to the data retiming unit 117d of FIG. 12, the data retiming unit 117e may further include fourth and fifth multiplexers MUX4 and MUX5. The fourth multiplexer MUX4 may receive rearranged first data DATA1' from a first flip-flop FF1, and may receive the first data DATA1 through a sixth terminal T6 and a fifth receiving node RX5. In response to an enable signal EN, the fourth multiplexer MUX4 may transmit the rearranged first data DATA1' or the first data DATA1 to a fifth transmitting node TX5.

The fifth multiplexer MUX5 may receive rearranged first data DATA1' from a second flip-flop FF2, and may receive the first data DATA1 through a fifth terminal T5 and a fourth receiving node RX4. In response to an enable signal EN, the fifth multiplexer MUX5 may transmit the rearranged first data DATA1' or the first data DATA1 to a fourth transmitting node TX4.

When the enable signal EN is in an enabled state, the internal signal iDQS may be outputted as a data strobe signal DQS through the second multiplexer MUX2 or the third multiplexer MUX3.

When the enable signal EN is in a disabled state, the data strobe signal DQS may be outputted through the second multiplexer MUX2 or the third multiplexer MUX3.

When the enable signal EN is in an enabled state, first data DATA1' rearranged in synchronization with the internal signal iDQS may be outputted through the fourth multiplexer MUX4 or the fifth multiplexer MUX5. When the enable signal EN is in a disabled state, first data DATA1' synchronized with the internal signal iDQS may be outputted through the fourth multiplexer MUX4 or the fifth multiplexer MUX5.

In other words, the interface chip 113e may selectively perform a retiming operation according to the enable signal EN. In an embodiment, the enable signal EN may be provided from the memory controller 120. For example, the enable signal EN may be provided to the interface chip 113e or the semiconductor memory device 110, and may be generated according to a value of a register controlled by the memory controller 120.

Figure 14:
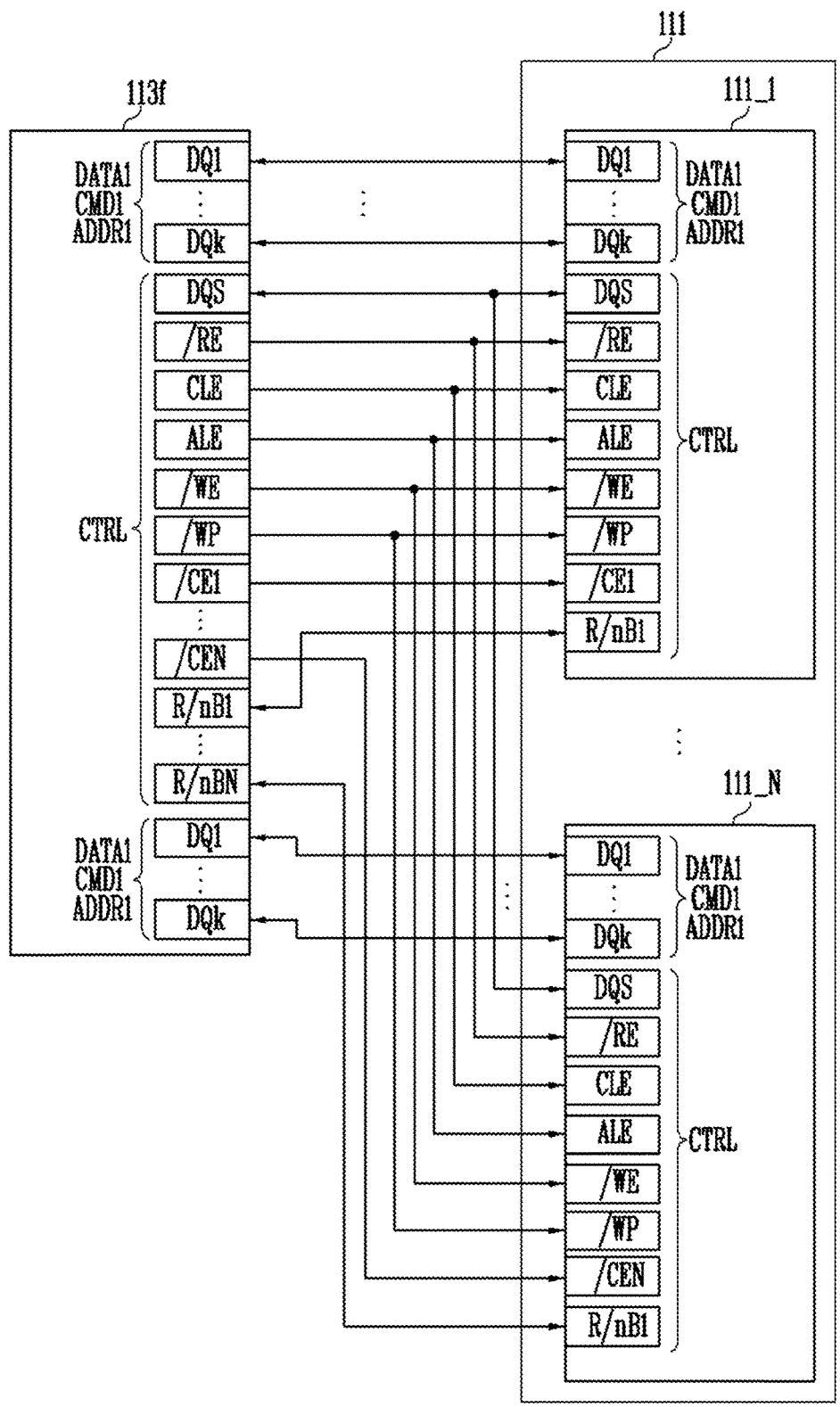
FIG. 14 is a block diagram illustrating other examples of relationships between an interface chip and a memory unit.

FIG. 14 is a block diagram illustrating an example of relationship between an interface chip 113f and a memory unit 111.

The interface chip 113f may include separate input/output pads DQ1 to DQk for communication with first to N-th memory chips 111_1 to 111_N. The input/output pads DQ1 to DQk to be used for communication between the interface chip 113f and the first memory chip 111_1 may differ from the input/output pads DQ1 to DQk to be used for communication between the interface chip 113f and the N-th memory chip 111_N.

Figure 15:
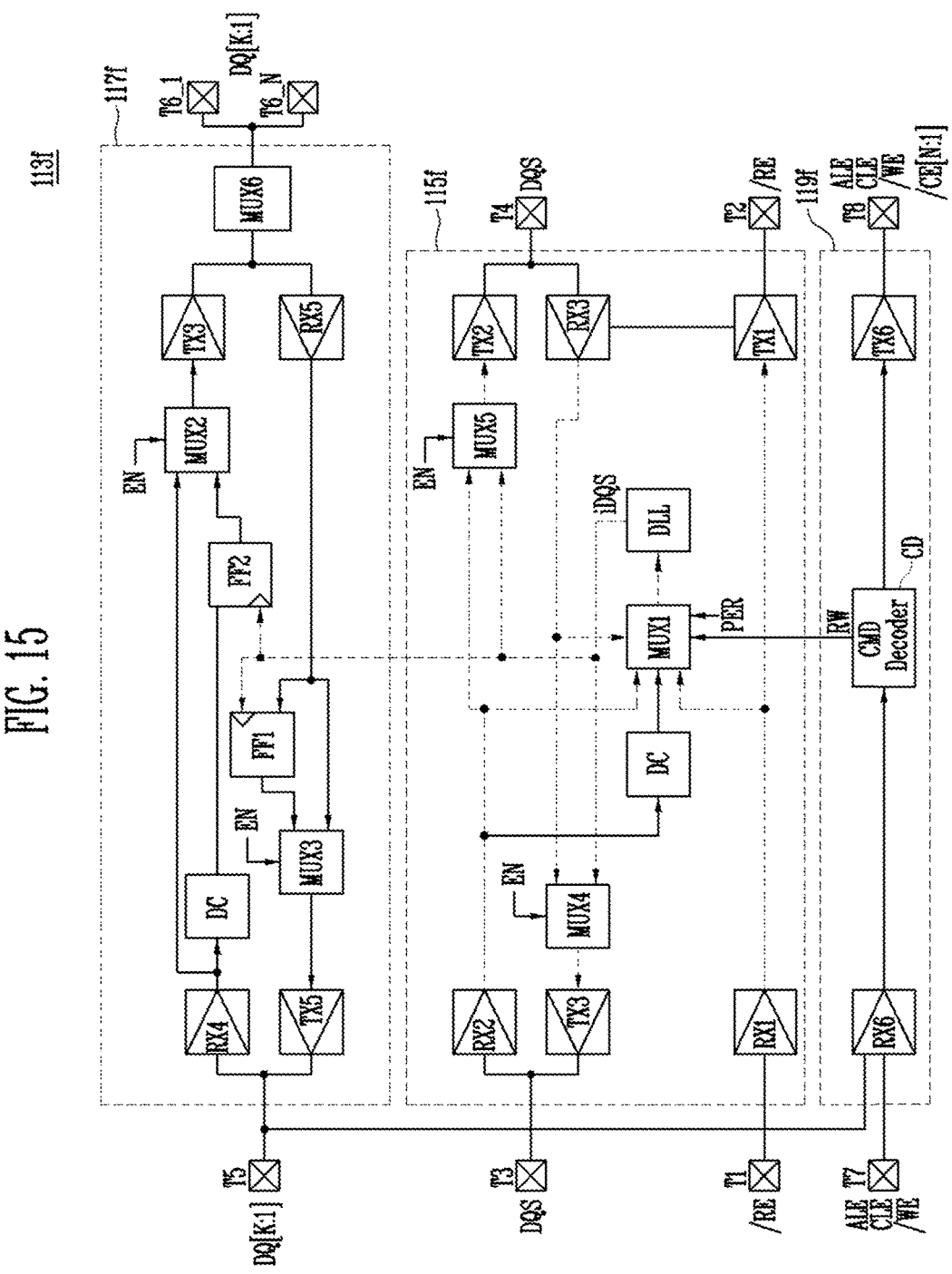
FIG. 15 illustrates an interface chip in accordance with other embodiments of the present disclosure.

FIG. 15 illustrates an interface chip 113f in accordance with other embodiments of the present disclosure.

Referring to FIGS. 14 and 15, the interface chip 113f may include a timing signal processing unit 115f, a data retiming unit 117f, and a command recognition unit 119f. The data retiming unit 117f may exchange first data DATA1, a first address ADDR1 or a first command CMD1 with the memory chips 111_1 to 111_N through a plurality of sixth terminals T6_1 to T6_N, respectively. Each of the sixth terminals T6_1 to T6_N may correspond to a set of first to N-th input/output pads DQ1 to DQk of the interface chip 113f illustrated in FIG. 14.

Compared to the data retiming unit 117e of FIG. 13, the data retiming unit 117f may further include a sixth multiplexer MUX6. The sixth multiplexer MUX6 may transmit the first data DATA1, the first command CMD1, or the first address ADDR1 received through a fourth transmitting node TX4, to one of the sixth terminals T6_1 to T6_N. For example, the sixth multiplexer MUX6 may receive a plurality of chip enable signals (not shown). The sixth multiplexer MUX6 may provide the first data DATA1, the first address ADDR1, or the first command CMD1 to one sixth terminal, corresponding to an enabled chip enable signal, among the sixth terminals T6_1 to T6_N.

The sixth multiplexer MUX6 may transfer the first data DATA1, received from one of the sixth terminals T6_1 to T6_N, to a fifth receiving node RX5.

Referring to FIGS. 14 and 15, the interface chip 113f has been illustrated as using different input/output pads to communicate with the memory chips 111_1 to 111_N. In this case, the number of sixth terminals T6_1 to T6_N of the data retiming unit 117f may be the same as the number of memory chips 111_1 to 111_N.

In an embodiment, the memory chips 111_1 to 111_N may be divided into a plurality of groups. Each of the groups may include two or more memory chips. The interface chip 113f may communicate with the plurality of groups through different input/output pads. In this case, the number of sixth terminals of the data retiming unit 117f may be the same as the number of groups. Two or more memory chips included in each group may share a single sixth terminal.

Figure 16:
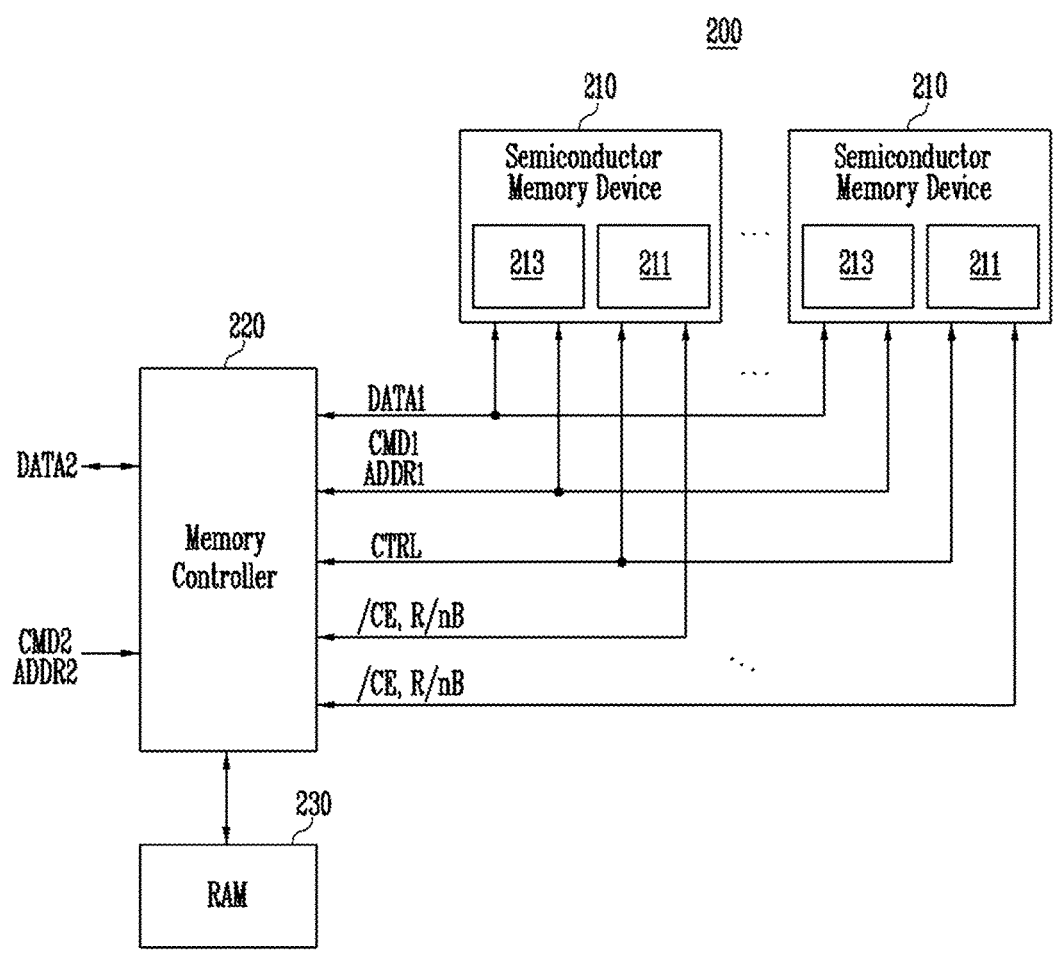
FIG. 16 is a block diagram illustrating a storage device in accordance with other embodiments of the present disclosure.

FIG. 16 is a block diagram illustrating a storage device 200 in accordance with the embodiments associated with FIG. 12 of the present disclosure.

Referring to FIG. 16, the storage device 200 may include a plurality of semiconductor memory devices 210, a memory controller 220, and a RAM 230. Each semiconductor memory device 210 may include a memory unit 211 and an interface chip 213. Each semiconductor memory device 210 may have the same structure as the semiconductor memory device 110 described with reference to FIGS. 2 to 15, and may operate in the same manner as that of the semiconductor memory device 110. The memory unit 211 may be formed of a plurality of memory chips. The interface chip 213 may perform a retiming operation between the plurality of memory chips and the memory controller 220.

The memory controller 220 may communicate first data DATA1, a first command CMD1, and a first address ADDR1 with the plurality of semiconductor memory devices 210 through a common channel. The memory controller 220 may exchange a control signal CTRL' with the plurality of semiconductor memory devices 210 through the common channel. The control signal CTRL' may include a command latch enable signal CLE, an address latch enable signal ALE, a read enable signal /RE, a write enable signal /WE, and a write protection signal /WP.

The memory controller 220 may communicate a chip enable signal /CE and a ready/busy signal R/nB with the plurality of semiconductor memory devices 210 through different channels. The memory controller 220 may control the chip enable signal /CE so that the semiconductor memory devices 210 or the memory units 211 included in each semiconductor memory device 210 can be individually selected. Furthermore, the memory controller 220 may determine whether the semiconductor memory devices 210 and the memory chips 211 included in each semiconductor memory device 210 are in a communicable state, based on the ready/busy signal R/nB.

Figure 17:
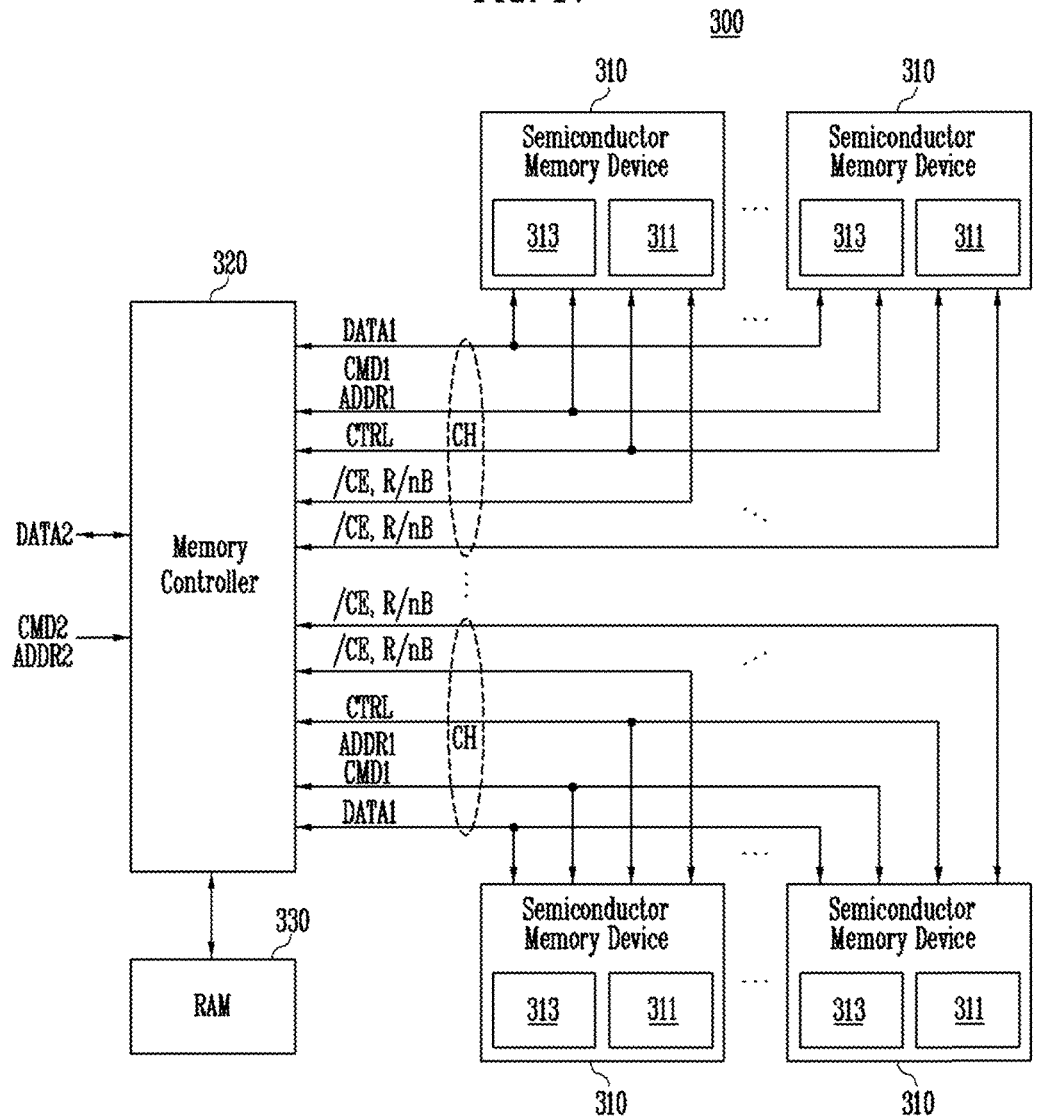
FIG. 17 is a block diagram illustrating a storage device in accordance with other embodiments of the present disclosure.

FIG. 17 is a block diagram illustrating a storage device 300 in accordance with the embodiments associated with FIG. 13 of the present disclosure.

Referring to FIG. 17, the storage device 300 may include a plurality of semiconductor memory devices 310, a memory controller 320, and a RAM 330. Each semiconductor memory device 310 may include a memory unit 311 and an interface chip 313. Each semiconductor memory device 310 may have the same structure as the semiconductor memory device 110 described with reference to FIGS. 2 to 15, and may operate in the same manner as that of the semiconductor memory device 110. The memory unit 311 may be formed of a plurality of memory chips. The interface chip 313 may perform a retiming operation between the plurality of memory chips and the memory controller 320.

The semiconductor memory devices 310 may communicate with the memory controller 320 through a plurality of channels CH. Semiconductor memory devices 310 coupled to different channels CH may independently communicate with the memory controller 320. In each channel CH, the memory controller 320 may communicate first data DATA1, a first command CMD1, and a first address ADDR1 with the corresponding semiconductor memory devices 310 through a common channel. In each channel CH, the memory controller 320 may exchange a control signal CTRL' with the corresponding semiconductor memory devices 310 through the common channel. The control signal CTRL' may include a command latch enable signal CLE, an address latch enable signal ALE, a read enable signal /RE, a write enable signal /WE, and a write protection signal /WP.

In each channel CH, the memory controller 320 may communicate a chip enable signal /CE and a ready/busy signal R/nB with the corresponding semiconductor memory devices 310 through different channels. In each channel CH, the memory controller 310 may control the chip enable signal /CE so that the corresponding semiconductor memory devices 310 or the memory units 311 included in each corresponding semiconductor memory device 310 can be individually selected. Furthermore, in each channel CH, the memory controller 320 may determine whether the corresponding semiconductor memory devices 310 and the memory chips 310 included in each corresponding semiconductor memory device 310 are in a communicable state, based on the ready/busy signal R/nB.

Figure 18:
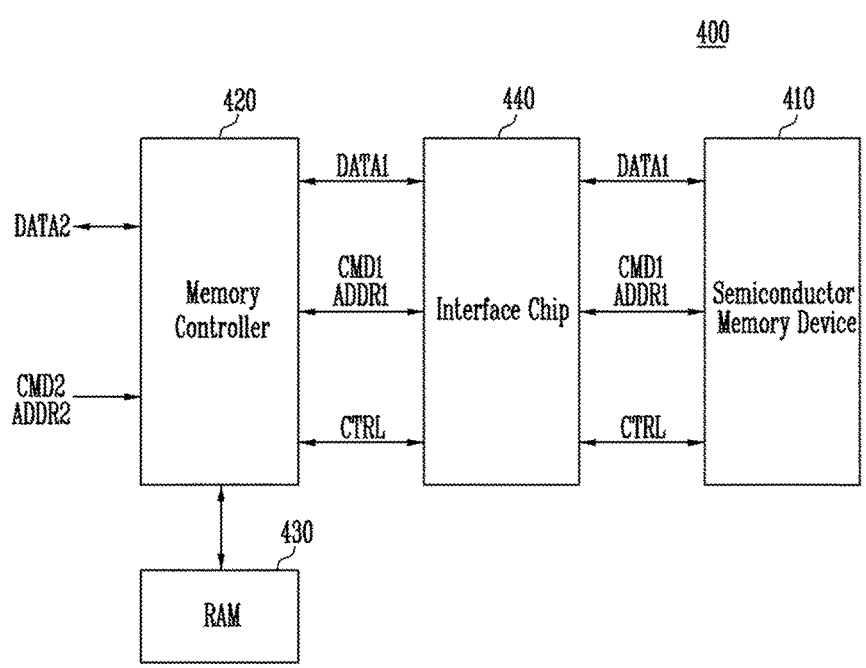
FIG. 18 is a block diagram illustrating a storage device in accordance with other embodiments of the present disclosure.

FIG. 18 is a block diagram illustrating a storage device 400 in accordance with the embodiments associated with FIG. 15 of the present disclosure.

Referring to FIG. 18, the storage device 400 may include a semiconductor memory device 410, a memory controller 420, a RAM 430, and an interface chip 440. The interface chip 440 may be provided outside the semiconductor memory device 410 rather than being provided inside the semiconductor memory device 410. The interface chip 440 may rearrange first data DATA1 between the semiconductor memory device 410 and the memory controller 420.

The semiconductor memory device 410 may be formed of a plurality of memory chips. The interface chip 440 may communicate with a plurality of memory chips.

Figure 19:
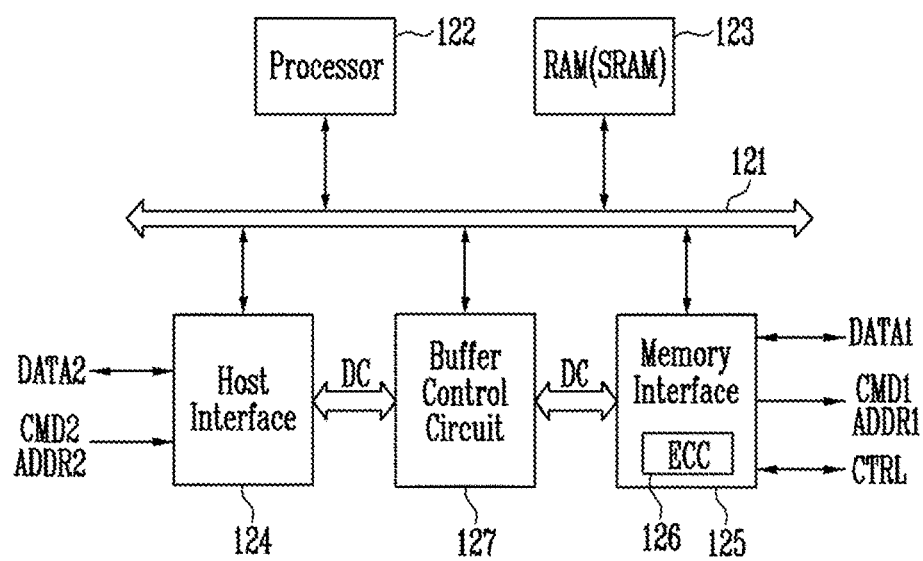
FIG. 19 is a block diagram illustrating a memory system in accordance with an embodiment of the present disclosure.

FIG. 19 is a block diagram illustrating a memory system 120 in accordance with an embodiment of the present disclosure.

Referring to FIGS. 1 and 18, the memory system 120 may include a bus 121, a processor 122, a RAM 123, a host interface 124, a memory interface 125, and a buffer control circuit 127.

The bus 121 may provide a channel between components of the memory system 120. For example, a second command CMD2 and a second address ADDR2 which are provided from an external host device to the memory system 120 may be transmitted to the processor 122 through the bus 121. The processor 122 may generate a first command CMD1 and a first address ADDR1, based on the second command CMD2 and the second address ADDR2. The first command CMD1 and the first address ADDR1 may be transmitted to the memory interface 125 through the bus 121. In other words, the bus 121 may provide a path through which a command and an address are transmitted among the host interface 124, the processor 122, and the memory interface 125. Also, the bus 121 may provide a control channel through which the processor 122 controls the host interface 124, the memory interface 125, and the buffer control circuit 127. The bus 121 may provide an access channel through which the processor 122 accesses the RAM 123.

The processor 122 may control the overall operation of the memory system 120 and perform a logical operation. The processor 122 may communicate with the external host device through the host interface 125. The processor 122 may store, in the RAM 123, the second command CMD2 or the second address ADDR2 received through the host interface 124. The processor 122 may generate a first command CMD1 and a first address ADDR1 according to a command or an address stored in the RAM 123, and may output the generated first command CMD1 and first address ADDR1 through the memory interface 125.

For example, the second address ADDR2 may be a logical address which is used in a host device, and the first address ADDR1 may be a physical address which is used in the semiconductor memory device 110. The processor 122 may load, on the RAM 123, information which is used to convert the second address ADDR2 into the first address ADDR1, and may refer to the information loaded on the RAM 123.

Under the control of the processor 122, data received through the host interface 124 may be outputted through the buffer control circuit 127. The data received through the buffer control circuit 127 may be transmitted to the memory interface 125 under the control of the processor 122. Under the control of the processor 122, the data received through the memory interface 125 may be outputted through the buffer control circuit 127. The processor 122 may output, to the host interface 124 or the memory interface 125, data received through the buffer control circuit 127.

The RAM 123 may be used as a working memory, a cache memory, or a buffer memory of the processor 122. The RAM 123 may store codes and commands to be executed by the processor 122. The RAM 123 may store data to be processed by the processor 122. The RAM 123 may include a static RAM (SRAM).

The host interface 124 may communicate with the external host device under the control of the processor 122. The host interface 124 may perform communication using at least one of various communication methods such as Universal Serial Bus (USB), Serial AT Attachment (SATA), High Speed Interchip (HSIC), Small Computer System Interface (SCSI), FireWire, Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), and so forth.

The host interface 124 may transmit the second command CMD2 and the second address ADDR2 received from the host device to the processor 122 through the bus 121. The host interface 124 may transmit the second data DATA2 received from the host device to the buffer control circuit 127 through a data channel DC. The host interface 124 may output the second data DATA2 received from the buffer control circuit 127 to the host device.

The memory interface 125 may communicate with the semiconductor memory device 110 (see FIG. 1) under the control of the processor 122. The memory interface 125 may receive a first command CMD1 and a first address ADDR1 from the processor 122 through the bus 121. The memory interface 125 may output the first command CMD1 and the first address ADDR1 to the semiconductor memory device 110. Also, the memory interface 125 may generate a control signal CTRL based on the first command CMD1 and the first address ADDR1, and may output the generated control signal CTRL to the semiconductor memory device 110.

The memory interface 125 may receive the first data DATA1 from the buffer control circuit 127 through a data channel DC. The memory interface 125 may output the first data DATA1 received through the data channel DC to the semiconductor memory device 110. The memory interface 125 may receive the control signal CTRL and the first data DATA1 from the semiconductor memory device 110. The memory interface 125 may transmit the first data DATA1 received from the semiconductor memory device 110 to the buffer control circuit 127 through the data channel DC.

The memory interface 125 may include an error correction block 126. The error correction block 126 may perform an error correction operation. The error correction block 126 may generate parity for performing the error correction operation, based on the first data DATA1 to be outputted to the semiconductor memory device 110 through the memory interface 125. The generated parity, along with the first data DATA1, may be written in the semiconductor memory device 110. When the first data DATA1 is received from the semiconductor memory device 110, parity associated with the first data DATA1 may also be received. The error correction block (ECC) 126 may correct an error in the first data DATA1 using the first data DATA1 and the parity that are received through the memory interface 125.

The buffer control circuit 127 may control the RAM 123 under the control of the processor 122. The buffer control circuit 127 may write data in the RAM 130 (see FIG. 1) and read data from the RAM 130.

In an embodiment, the processor 122 may control the memory controller 120 using codes. The processor 122 may read codes from a nonvolatile memory (e.g., a read only memory) which is provided in the memory controller 120, and may store the read codes in the RAM 123 for execution. In an embodiment, the processor 122 may store codes received through the memory interface 125 in the RAM 123 for execution.

In an embodiment, the memory interface 125 or the processor 122 may further perform a randomization operation on the first data DATA1 to be written in the semiconductor memory device 110. The randomization operation may be an operation of coding the first data DATA1 arbitrarily or according to a predetermined rule to prevent a certain pattern from being generated in the first data DATA1. The memory interface 125 or the processor 122 may perform a derandomization operation on the first data DATA1 read from the semiconductor memory device 110.

In an embodiment, the memory interface 125 or the processor 122 may further perform an encryption operation in order to improve security of the first data DATA1 to be written in the semiconductor memory device 110. The memory interface 125 or the processor 122 may further perform a decryption operation on the first data DATA1 read from the semiconductor memory device 110. The encryption operation and the decryption operation may be performed according to the standard protocols such as data encryption Standard (DES), and advanced encryption standard (AES).

In an embodiment, the memory system 120 may be configured to provide an auxiliary power supply. For example, the memory system 120 may store power supplied from a host device in a charging unit such as a super capacitor. When the power supply to be supplied from the host device is suddenly interrupted, the memory system 120 may use power stored in the charging unit as the auxiliary power supply. The memory system 120 may perform a backup operation on an operating state of the memory system 120 or may write data that is not yet stored in the semiconductor memory device 110, using the auxiliary power supply. The memory system 120 may perform a normal power-off sequence using the auxiliary power supply.

Figure 20:
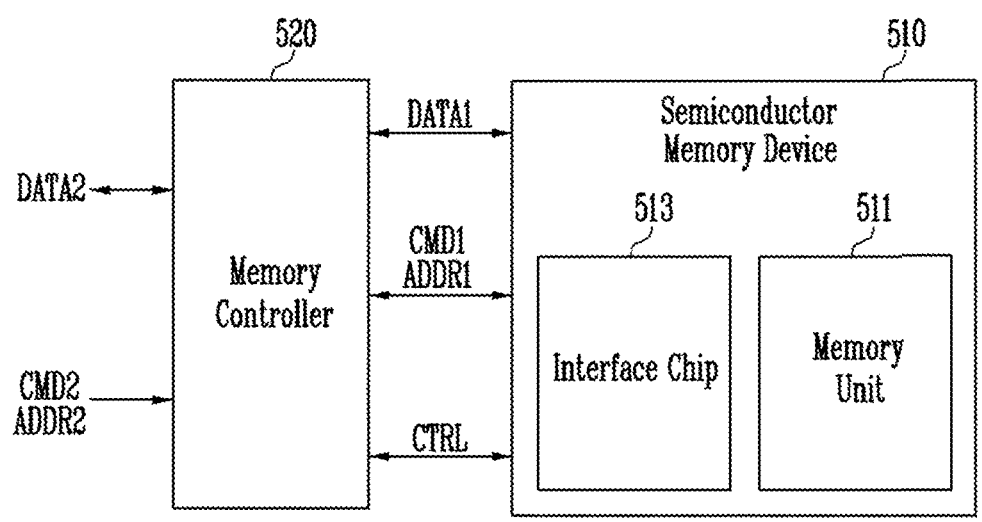
FIG. 20 is a block diagram illustrating a storage device in accordance with other embodiments of the present disclosure.

FIG. 20 is a block diagram illustrating a storage device 500 in accordance with other embodiments of the present disclosure.

Referring FIG. 20, the storage device 500 includes a semiconductor memory device 510 and a memory controller 520. The semiconductor memory device 510 may include a memory unit 511 and an interface chip 513.

The storage device 500 includes no RAM. The memory controller 520 may operate using an internal RAM in lieu of an external RAM.

Figure 21:
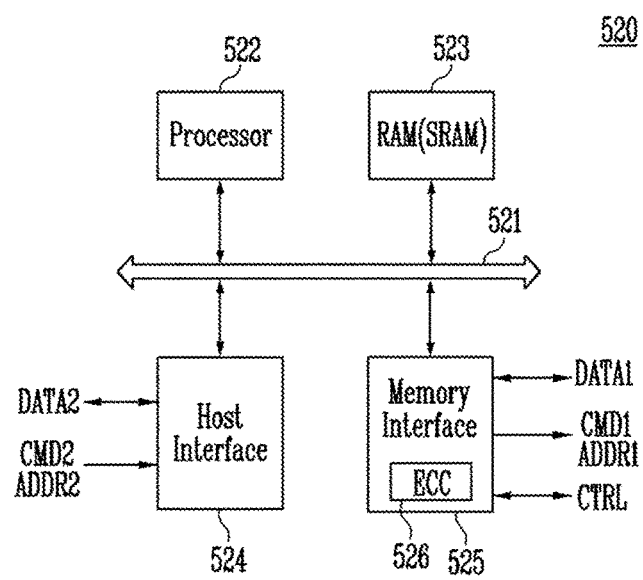
FIG. 21 is a block diagram illustrating a memory controller of FIG. 20.

FIG. 21 is a block diagram illustrating a memory controller 520 of FIG. 20.

Referring to FIG. 21, the memory controller 520 may include a bus 521, a processor 522, a RAM 523, a host interface 524, and a memory interface 525.

The bus 521 may provide a channel between components of the memory controller 520.

The processor 522 may control the overall operation of the memory controller 520 and perform a logical operation. The processor 522 may communicate with an external host device through the host interface 524. The processor 522 may store, in the RAM 523, the second command CMD2 or the second address ADDR2 received through the host interface 524. The processor 522 may generate a first command CMD1 and a first address ADDR1 according to a command or an address stored in the RAM 523, and may output the generated first command CMD1 and first address ADDR1 through the memory interface 525.

For example, the second address ADDR2 may be a logical address which is used in a host device, and the first address ADDR1 may be a physical address which is used in the semiconductor memory device 510 (see FIG. 19). The processor 522 may load, on the RAM 523, information which is used to convert the second address ADDR2 into the first address ADDR1, and may refer to the information loaded on the RAM 523.

The processor 522 may store, in the RAM 523, second data DATA2 received through the host interface 524. The processor 522 may transmit data stored in the RAM 523 to the memory interface 525 as first data DATA1. The processor 522 may store, in the RAM 523, the first data DATA1 received through the memory interface 525. The processor 522 may output data stored in the RAM 523, through the memory interface 525 as second data DATA2.

The RAM 523 may be used as a working memory, a cache memory, or a buffer memory of the processor 522. The RAM 523 may store codes and commands to be executed by the processor 522. The RAM 523 may store data to be processed by the processor 522. The RAM 523 may store first data DATA1 to be written in the semiconductor memory device 510 or first data DATA1 read from the semiconductor memory device 510. The RAM 523 may include an SRAM.

The host interface 524 may communicate with the external host device under the control of the processor 522. The host interface 524 may perform communication using at least one of various communication methods such as Universal Serial Bus (USB), Serial AT Attachment (SATA), High Speed Interchip (HSIC), Small Computer System Interface (SCSI), FireWire, Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), and so forth.

The host interface 524 may transmit the second command CMD2 and the second address ADDR2 received from the host device to the processor 522 through the bus 521. The host interface 524 may transmit the second data DATA2 received from the host device to the RAM 523 through the bus 521. The host interface 524 may output, to the host device, the second data DATA2 received from the RAM 523 through the bus 521.

The memory interface 525 may communicate with the semiconductor memory device 510 under the control of the processor 522. The memory interface 525 may receive a first command CMD1 and a first address ADDR1 from the processor 522 through the bus 521. The memory interface 525 may output the first command CMD1 and the first address ADDR1 to the semiconductor memory device 510. Also, the memory interface 525 may generate a control signal CTRL based on the first command CMD1 and the first address ADDR1, and may output the generated control signal CTRL to the semiconductor memory device 510.

The memory interface 525 may output, to the nonvolatile memory 510, the first data DATA1 received from the RAM 523 through the bus 521. The memory interface 525 may receive the control signal CTRL and the first data DATA1 from the semiconductor memory device 510. The memory interface 521 may transmit the first data DATA1 received from the semiconductor memory device 510 to the RAM 523 through the bus 521.

The memory interface 525 may include an error correction block (ECC) 526. The error correction block 526 may perform an error correction operation. The error correction block 526 may generate parity for performing the error correction operation, based on the first data DATA1 to be outputted to the semiconductor memory device 510 through the memory interface 525. The generated parity, along with the first data DATA1, may be written in the semiconductor memory device 510. When the first data DATA1 is received from the semiconductor memory device 510, parity associated with the first data DATA1 may also be received. The error correction block 526 may correct an error in the first data DATA1 using the first data DATA1 and the parity that are received through the memory interface 525.

In an embodiment, the processor 522 may control the memory controller 520 using codes. The processor 522 may read codes from a nonvolatile memory (e.g., a read only memory) which is provided in the memory controller 520, and may store the read codes in the RAM 523 for execution. In an embodiment, the processor 522 may store codes received through the memory interface 525 in the RAM 523 for execution.

In an embodiment, the memory interface 525 or the processor 522 may further perform a randomization operation on the first data DATA1 to be written in the semiconductor memory device 510. The randomization operation may be an operation of coding the first data DATA1 arbitrarily or according to a predetermined rule so as to prevent a certain pattern from being generated in the first data DATA1. The memory interface 525 or the processor 522 may perform a derandomization operation on the first data DATA1 read from the semiconductor memory device 510.

In an embodiment, the memory interface 525 or the processor 522 may further perform an encryption operation in order to improve security of the first data DATA1 to be written in the semiconductor memory device 510. The memory interface 525 or the processor 522 may further perform a decryption operation on the first data DATA1 read from the semiconductor memory device 510. The encryption operation and the decryption operation may be performed according to the standard protocols such as data encryption Standard (DES), and advanced encryption standard (AES).

In an embodiment, the memory controller 520 may be configured to provide an auxiliary power supply. For example, the memory controller 520 may store power supplied from a host device in a charging unit such as a super capacitor. When the power supply to be supplied from the host device is suddenly interrupted, the memory controller 520 may use power stored in the charging unit as the auxiliary power supply. The memory controller 520 may perform a backup operation on an operating state of the memory controller 520 or may write data that is not yet stored in the semiconductor memory device 510, using the auxiliary power supply. The memory controller 520 may perform a normal power-off sequence using the auxiliary power supply.

Figure 22:
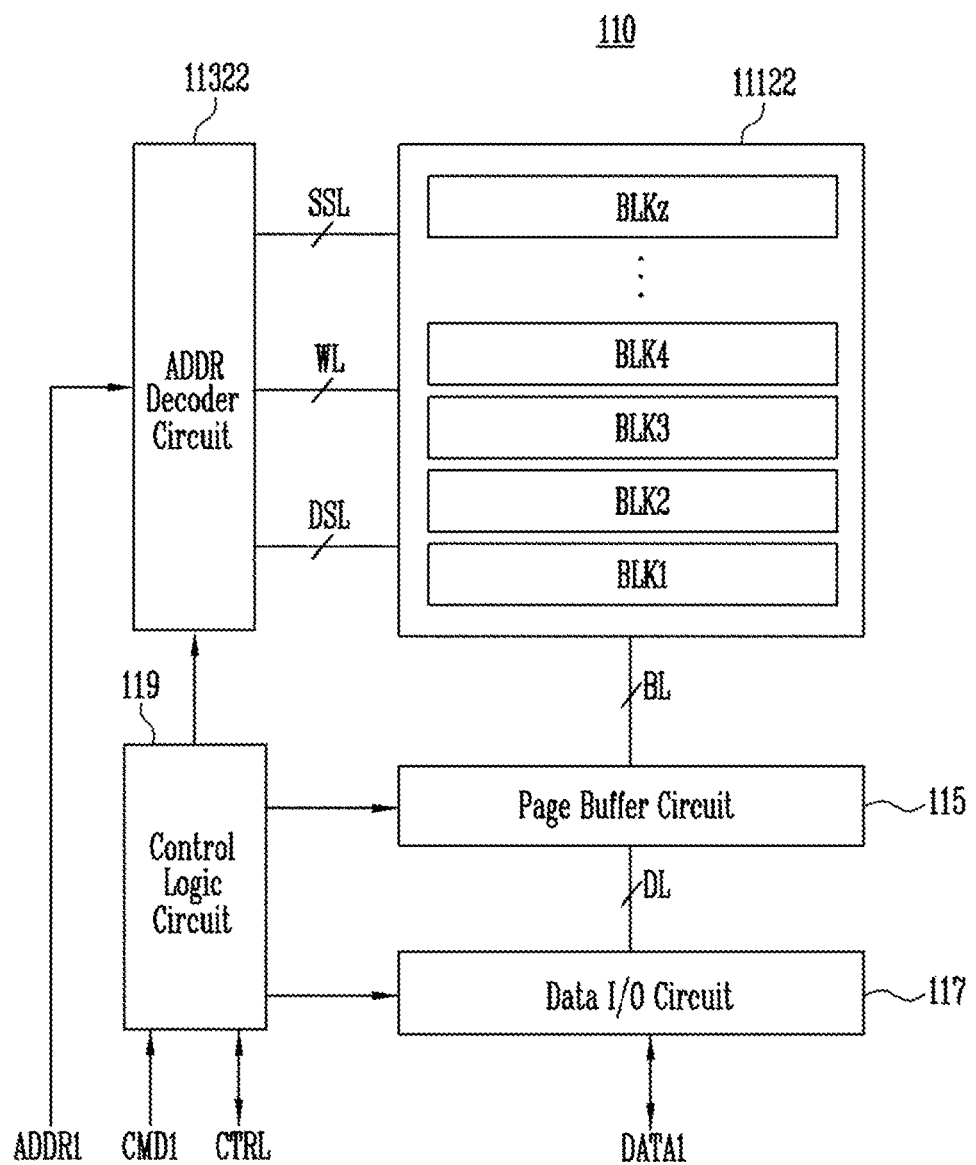
FIG. 22 is a block diagram illustrating a semiconductor memory device in accordance with to an embodiment of the present disclosure.

FIG. 22 is a block diagram illustrating a semiconductor memory device 110 in accordance with to an embodiment of the present disclosure.

Referring to FIGS. 1 and 22, the semiconductor memory device 110 may include a memory cell array 11122, an address decoder circuit 11322, a page buffer circuit 115, a data input/output (I/O) circuit 117, and a control logic circuit 119. In an embodiment, for example, the interface chip 113 may include an address decoder circuit 11322. In an embodiment, for example, the memory unit 111 may include a memory cell array 11122.

The memory cell array 11122 may include a plurality of memory blocks BLK1 to BLKz. Each of the memory blocks BLK1 to BLKz may include a plurality of memory cells. Each of the memory blocks BLK1 to BLKz may be coupled to the address decoder circuit 11322 through at least one source select line SSL, a plurality of word lines WL, and at least one drain select line DSL. Each the memory blocks BLK1 to BLKz may be coupled to the page buffer circuit 115 through a plurality of bit lines BL. The memory blocks BLK1 to BLKz may be coupled in common to the bit lines BL. The memory cells of the memory blocks BLK1 to BLKz may have the same structures. In an embodiment, each of the memory blocks BLK1 to BLKz may be the unit of an erase operation. The memory cells of the memory cell array 11122 may be erased on a memory block basis. The memory cells included in each memory block may be erased at the same time.

The address decoder circuit 11322 may be coupled to the memory cell array 11122 through a plurality of source select lines SSL, the plurality of word lines WL, and a plurality of drain select lines DSL. The address decoder circuit 11322 may operate under the control of the control logic circuit 119. The address decoder circuit 11322 may receive a first address ADDR1 from the memory controller 120 The address decoder circuit 11322 may decode the received first address ADDR1 and may control voltages to be applied to the word lines WL according to the decoded address.

For example, during a write operation, the address decoder circuit 11322 may apply a program voltage VGPM to a selected word line of a selected memory block which is indicated by the first address ADDR1, and may also apply a pass voltage VPASS to unselected word lines of the selected memory block. During a read operation, the address decoder circuit 11322 may apply a select read voltage VRD to a selected word line of a selected memory block which is indicated by the first address ADDR1, and may also apply a unselect read voltage VREAD to unselected word lines of the selected memory block. During an erase operation, the address decoder circuit 11322 may apply an erase voltage (e.g., a ground voltage) to word lines of a selected memory block which is indicated by the first address ADDR1.

The page buffer circuit 115 may be coupled to the memory cell array 11122 through the bit lines BL. The page buffer circuit 115 may be coupled to a data input/output circuit 117 through a plurality of data lines DL. The page buffer circuit 115 may operate under the control of the control logic circuit 119.

The page buffer circuit 115 may store data to be written in the memory cells of the memory cell array 11122 or data read from the memory cells. During a write operation, the page buffer circuit 115 may store data to be written in the memory cells. The page buffer circuit 115 may bias the plurality of bit lines BL based on the stored data. During a write operation, the page buffer circuit 115 may function as a write driver. During a read operation, the page buffer circuit 115 may sense voltages of the plurality of bit lines BL, and may store the sensing results. During a write operation, the page buffer circuit 115 may function as a sense amplifier.

The data input/output circuit 117 may be coupled to the page buffer circuit 115 through the data lines DL. The data input/output circuit 117 may exchange first data DATA1 with the memory controller 120.

The data input/output circuit 117 may temporarily store first data DATA1 received from the memory controller 120. The data input/output circuit 117 may transmit that stored data to the page buffer circuit 115. The data input/output circuit 117 may temporarily store data DATA received from the page buffer circuit 115. The data input/output circuit 117 may transmit the stored data DATA to the memory controller 120. The data input/output circuit 117 may function as a buffer memory.

The control logic circuit 119 may receive a first command CMD1 and a control signal CTRL from the memory controller 120. The control logic circuit 119 may decode the received first command CMD1 and control the overall operation of the semiconductor memory device 110 according to the decoded command.

Figure 23:
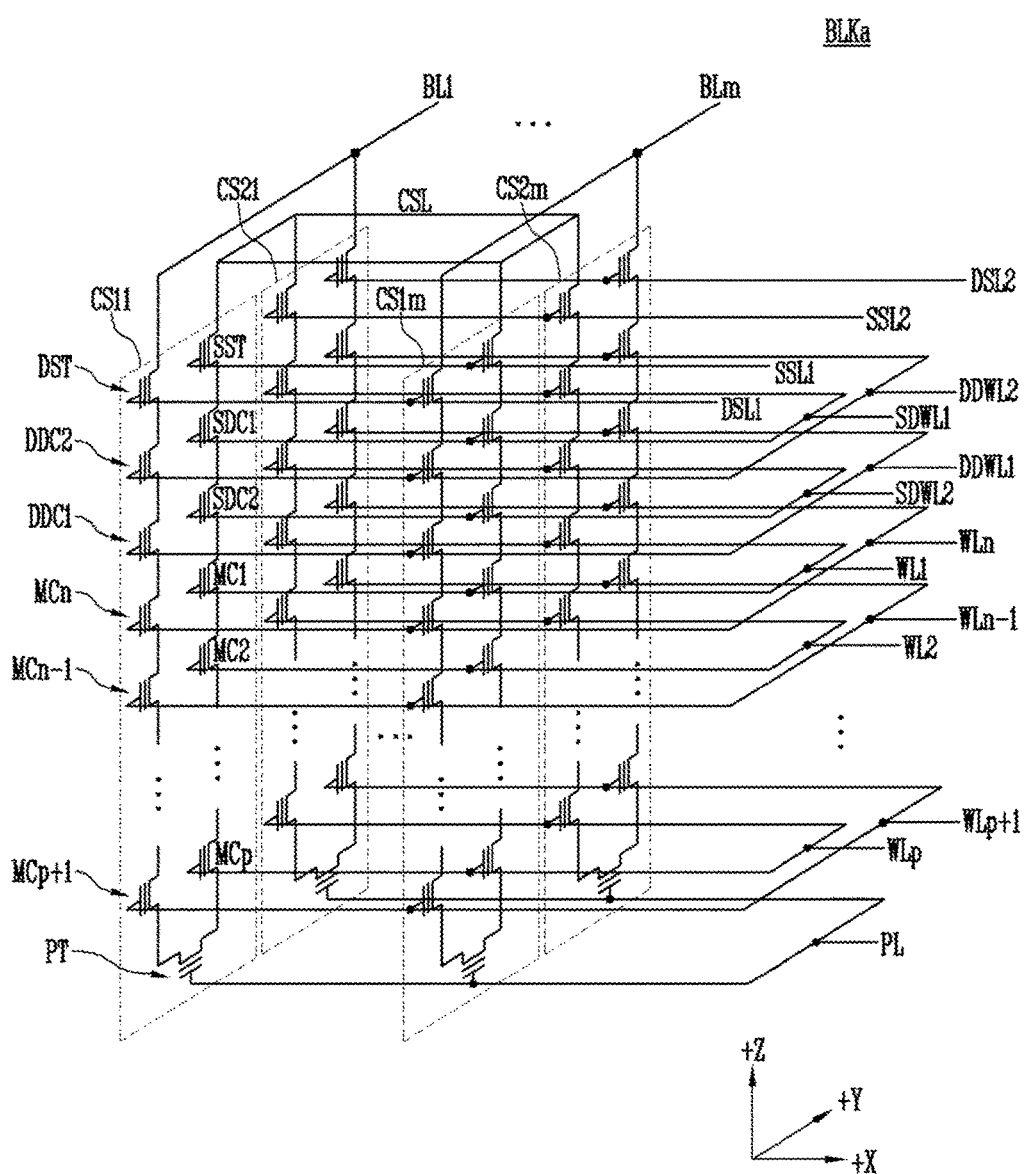
FIG. 23 is a circuit diagram illustrating any one of memory blocks of FIG. 22.

FIG. 23 is a circuit diagram illustrating a memory block BLKa which may be any one of memory blocks BLK1 to BLKz of FIG. 22.

Referring to FIG. 23, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., a positive (+) X direction). In FIG. 23, two cell strings are illustrated as being arranged in a column direction (i.e., a positive (+) Y direction). However, this illustration is made for convenience of description, and it will be understood that three or more cell strings may be arranged in the column direction.

Each of the cell strings CS11 to CS1$m$ and CS21 to CS2$m$ may include at least one source select transistor SST, at least one or more source-side dummy memory cells SDC1 and SDC2, first to n-th normal memory cells MC1 to MCn, a pipe transistor PT, at least one or more drain-side dummy memory cells DDC1 and DDC2, and at least one drain select transistor DST.

The select transistors SST and DST, the dummy memory cells SDC1, SDC2, DDC1, and DDC2, and the normal memory cells MC1 to MCn may have structures similar to each other. In an embodiment, each of the select transistors SST and DST, the dummy memory cells SDC1, SDC2, DDC1, and DDC2, and the normal memory cells MC1 to MCn may include a channel layer, a tunneling insulating layer, a charge storage layer, and a blocking insulating layer.

The source select transistor SST of each cell string is coupled between a common source line CSL and the source-side dummy memory cells SDC1 and SDC2.

In an embodiment, source select transistors of the cell strings that are arranged in the same row may be coupled to a source select line extending in the row direction. Source select transistors of the cell strings that are arranged in different rows may be coupled to different source select lines. In FIG. 23, source select transistors of the cell strings CS11 to CS1$m$ in a first row are coupled to a first source select line SSL1. Source select transistors of the cell strings CS21 to CS2$m$ in a second row are coupled to a second source select line SSL2.

Each cell string may include two source-side dummy memory cells SDC1 and SDC2. However, this illustration is made for convenience of description, and it will be understood that three or more source-side dummy memory cells may be provided in each cell string. The source-side dummy memory cells SDC1 and SDC2 of each cell string may be coupled in series between the source select transistor SST and the normal memory cells MC1 to MCp. A gate of a first source-side dummy memory cell SDC1 of each cell string may be coupled to a first source-side dummy word line SDWL1. A gate of a second source-side dummy memory cell SDC2 of each cell string may be coupled to a second source-side dummy word line SDWL2.

First to n-th normal memory cells MC1 to MCn of each cell string may be coupled between the source-side dummy memory cells SDC1 and SDC2 and the drain-side dummy memory cells DDC1 and DDC2.

The first to n-th normal memory cells MC1 to MCn may be divided into first to p-th normal memory cells MC1 to MCp and p+1-th to n-th normal memory cells MCp+1 to MCn. The first to p-th normal memory cells MC1 to MCp may be successively arranged in a direction opposite to a positive (+) Z direction, and may be coupled in series between the source-side dummy memory cells SDC1 and SDC2 and the pipe transistor PT. The p+1-th to n-th normal memory cells MCp+1 to MCn may be successively arranged in the +Z direction, and may be coupled in series between the pipe transistor PT and the drain-side dummy memory cells DDC1 and DDC2. The first to p-th normal memory cells MC1 to MCp and the p+1-th to n-th normal memory cells MCp+1 to MCn may be coupled to each other through the pipe transistor PT. The gates of the first to n-th normal memory cells MC1 to MCn of each cell string may be coupled to first to n-th normal word lines WL1 to WLn, respectively.

Data may be stored in the first to n-th normal memory cells MC1 to MCn through the first to m-th bit lines BL1 to BLm. The data stored in the first to n-th normal memory cells MC1 to MCn may be read through the first to m-th bit lines BL1 to BLm.

A gate of the pipe transistor PT of each cell string may be coupled to a pipeline PL.

Each cell string may include two drain-side dummy memory cells DDC1 and DDC2. However, this illustration is made for convenience of description, and it will be understood that three or more drain-side dummy memory cells may be provided in each cell string. The drain-side dummy memory cells DDC1 and DDC2 of each cell string may be coupled in series between the drain select transistor DST and the normal memory cells MCp+1 to MCn. A gate of a first drain-side dummy memory cell DDC1 of each cell string may be coupled to a first drain-side dummy word line DDWL1. A gate of a second drain-side dummy memory cell DDC2 of each cell string may be coupled to a second drain-side dummy word line DDWL2.

The drain select transistor DST of each cell string may be coupled between the corresponding bit line and the drain-side dummy memory cells DDC1 and DDC2. The cell strings arranged in the row direction may be coupled to drain select lines extending in the row direction. Drain select transistors of the cell strings CS11 to CS1$m$ in the first row may be coupled to a first drain select line DSL1. Drain select transistors of the cell strings CS21 to CS2$m$ in the second row may be coupled to a second drain select line DSL2.

Cell strings arranged in the column direction may be coupled to bit lines extending in the column direction. In FIG. 23, cell strings CS11 and CS21 in a first column are coupled to a first bit line BL1. Cell strings CS1$m$ and CS2$m$ in an m-th column are coupled to an m-th bit line BLm.

In an embodiment, even bit lines and odd bit lines may be provided in lieu of the first to m-th bit lines BL1 to BLm. Even-number-th cell strings of the cell strings CS11 to CS1*m* or CS21 to CS2*m* arranged in the row direction may be coupled to respective even bit lines. Odd-number-th cell strings of the cell strings CS11 to CS1*m* or CS21 to CS2*m* arranged in the row direction may be coupled to respective odd bit lines.

In an embodiment, the dummy memory cells SDC1, SDC2, DDC1, and DDC2 may be provided to stably control the voltage or current of the corresponding cell string. For example, the source-side dummy memory cells SDC1 and SDC2 may be provided to reduce an electric field between the source select transistor SST and the normal memory cells MC1 to MCp. For example, the drain-side dummy memory cells DDC1 and DDC2 may be provided to reduce an electric field between the drain select transistor DST and the normal memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cells SDC1, SDC2, DDC1, and DDC2, it is required for each of the dummy memory cells SDC1, SDC2, DDC1, and DDC2 to have a desired threshold voltage. Before an erase operation on the memory block BLKa is performed, pre-program operations may be performed on all or some of the dummy memory cells SDC1, SDC2, DDC1, and DDC2. When an erase operation is performed after the pre-program operations have been performed, the threshold voltages of the dummy memory cells SDC1, SDC2, DDC1, and DDC2 may be adjusted to desired values by controlling voltages to be applied to the dummy word lines SDWL1, SDWL2, DDWL1, and DDWL2 coupled to the respective dummy memory cells SDC1, SDC2, DDC1, and DDC2.

Figure 24:
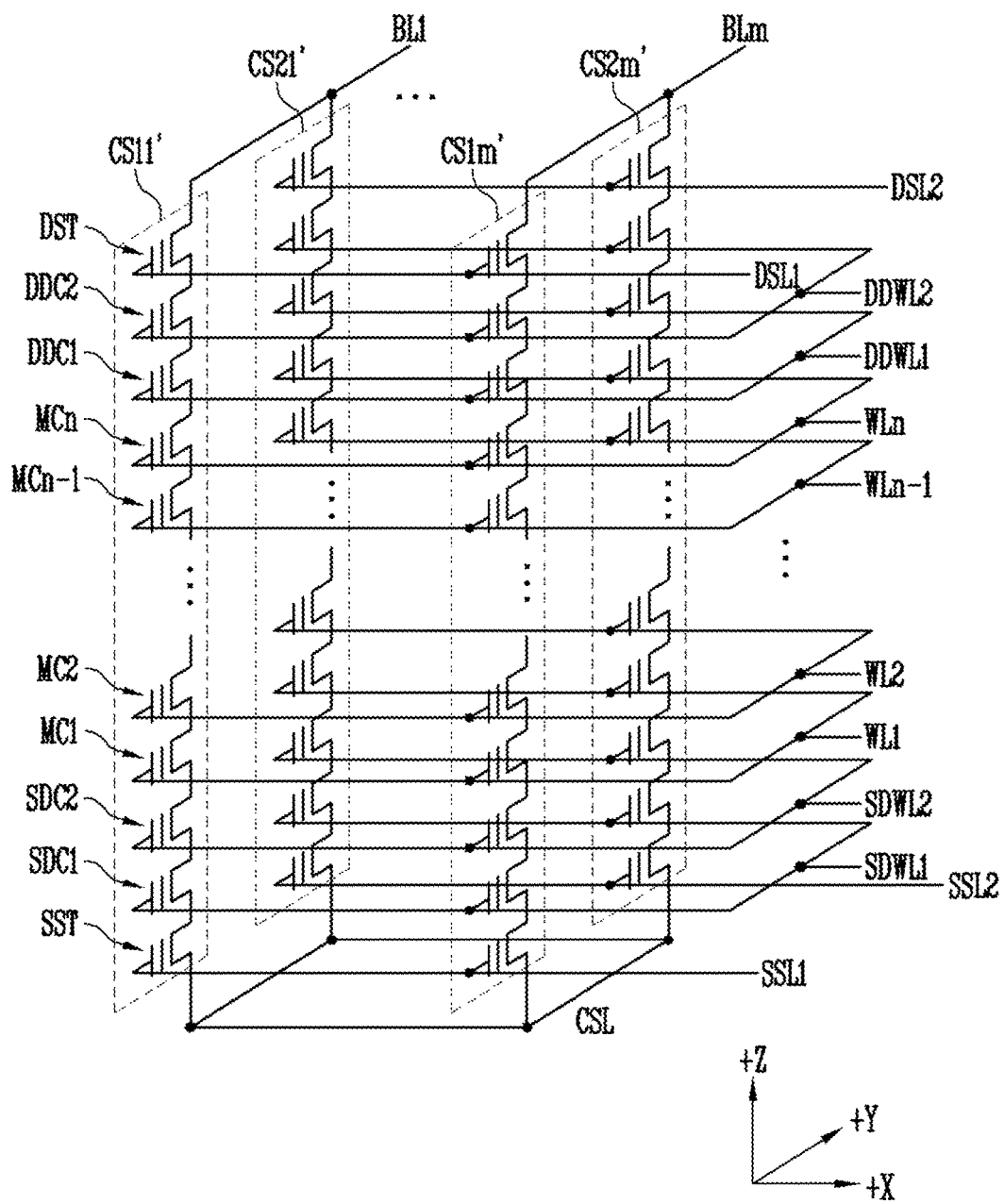
FIG. 24 is a circuit diagram illustrating an embodiment of the memory blocks of FIG. 22.

FIG. 24 is a circuit diagram illustrating a memory block BLKb which may be any one of the memory blocks BLK1 to BLKz of FIG. 22.

Referring to FIG. 24, a first memory block BLKb may include a plurality of cell strings CS11' to CS1*m*' and CS21' to CS2*m*'. Each of the cell strings CS11' to CS1*m*' and CS21' to CS2*m*' extends in a positive (+) Z direction. Each of the cell strings CS11' to CS1*m*' and CS21' to CS2*m*' may include at least one source select transistor SST placed on a substrate (not illustrated) under the memory block BLKb, at least one or more source-side dummy memory cells SDC1 and SDC2, first to n-th normal memory cells MC1 to MCn, at least one or more drain-side dummy memory cells DDC1 and DDC2, and at least one drain select transistor DST.

The source select transistor SST of each cell string may be coupled between the common source line CSL and the source-side dummy memory cells SDC1 and SDC2. Source select transistors of cell strings (e.g., CS11' to CS1*m*') arranged in the same row may be coupled to the same source select line (e.g., SSL1). Source select transistors of the cell strings CS11' to CS1*m*' arranged in a first row may be coupled to a first source select line SSL1. Source select transistors of the cell strings CS21' to CS2*m*' arranged in a second row may be coupled to a second source select line SSL2.

The source-side dummy memory cells SDC1 and SDC2 of each cell string may be coupled in series between the source select transistor SST and the normal memory cells MC1 to MCn. Source-side dummy memory cells provided on the same level may be coupled to the same source-side dummy word line. Gates of the first and second source-side dummy memory cells SDC1 and SDC2 may be respectively coupled to first and second source-side dummy word lines SDWL1 and SDWL2.

First to n-th normal memory cells MC1 to MCn of each cell string may be coupled in series between the source-side dummy memory cells SDC1 and SDC2 and the drain-side dummy memory cells DDC1 and DDC2. Gates of the first to n-th normal memory cells MC1 to MCn may be respectively coupled to first to n-th normal word lines WL1 to WLn.

The drain-side dummy memory cells DDC1 and DDC2 of each cell string may be coupled in series between the drain select transistor DST and the normal memory cells MC1 to MCn. Drain-side dummy memory cells provided on the same level may be coupled to the same source-side dummy word line. Gates of the first and second drain-side dummy memory cells DDC1 and DDC2 may be respectively coupled to first and second drain-side dummy word lines DDWL1 and DDWL2.

The drain select transistor DST of each cell string may be coupled between the corresponding bit line and the drain-side dummy memory cells DDC1 and DDC2. Drain select transistors of cell strings arranged in the row direction may be coupled to drain select lines extending in the row direction. Drain select transistors of the cell strings CS11' to CS1*m*' in the first row may be coupled to a first drain select line DSL1. Drain select transistors of the cell strings CS21' to CS2*m*' in the second row may be coupled to a second drain select line DSL2.

Consequentially, the memory block BLKb of FIG. 24 may have an equivalent circuit similar to that of the memory block BLKa of FIG. 23 except that a pipe transistor PT is excluded from each cell string.

The memory blocks BLKa and BLKb illustrated in FIGS. 23 and 24 are only for illustrative purpose. The spirit and scope of the present disclosure are not limited to the memory block BLKa or BLKb of FIG. 23 or 24. For example, the number of rows of cell strings may be increased or reduced. As the number of rows of cell strings is changed, the number of drain select lines or source select lines coupled to the rows of the cell strings and the number of cell strings coupled to each bit line may also be changed.

The number of columns of cell strings may be increased or reduced. As the number of columns of cell strings is changed, the number of bit lines coupled to the columns of the cell strings and the number of cell strings coupled to each string select line may also be changed.

The height of each cell string may be increased or reduced. For example, the number of drain select transistors, memory cells or source transistors stacked in each cell string may be increased or reduced.

Figure 25:
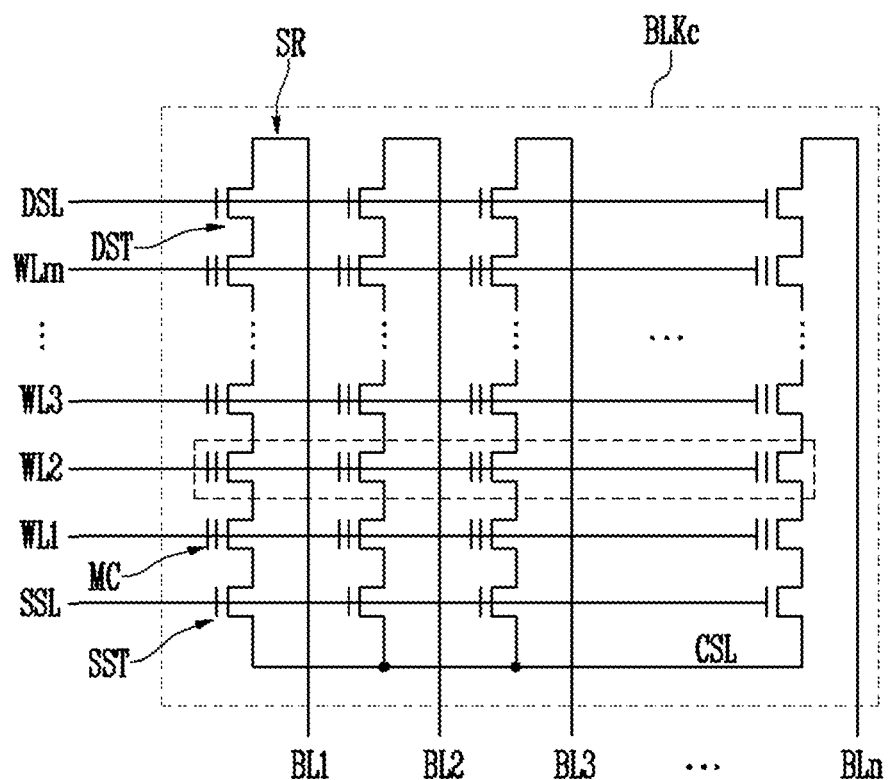
FIG. 25 is a circuit diagram illustrating an embodiment of the memory blocks of FIG. 22.

FIG. 25 is a circuit diagram illustrating a memory block BLKc which may be any one of the memory blocks BLK1 to BLKz of FIG. 22.

Referring to FIG. 25, the memory block BKLc may include a plurality of strings SR. The plurality of strings SR may be respectively coupled to a plurality of bit lines BL1 to BLn. Each string SR may include a source select transistor SST, memory cells MC, and a drain select transistor DST.

The source select transistor SST of each string SR may be coupled between the memory cells MC and a common source line CSL. The source select transistors SST of the strings SR may be coupled in common to the common source line CSL.

The drain select transistor DST of each string SR may be coupled between the memory cells MC and the corresponding bit line BL. The drain select transistors DST of the strings SR may be respectively coupled the bit lines BL1 to BLn. In an embodiment, for example, a drain select line may be coupled to the drain select transistor DST.

In each string SR, a plurality of memory cells MC may be provided between the source select transistor SST and the drain select transistor DST. In each string SR, the memory cells MC may be coupled in series with each other. In an embodiment, for example, a source select line may be coupled to the source select transistor SST.

In the strings SR, memory cells MC disposed in the same turn from the common source line CSL may be coupled in common to a single word line. The memory cells MC of the plurality of strings SR may be coupled to a plurality of word lines WL1 to WLm.

In the memory block BLKc, an erase operation may be performed on a memory block basis. When the erase operation is performed on a memory block basis, all memory cells of the memory block BLKc may be simultaneously erased in response to an erase request.

Figure 26:
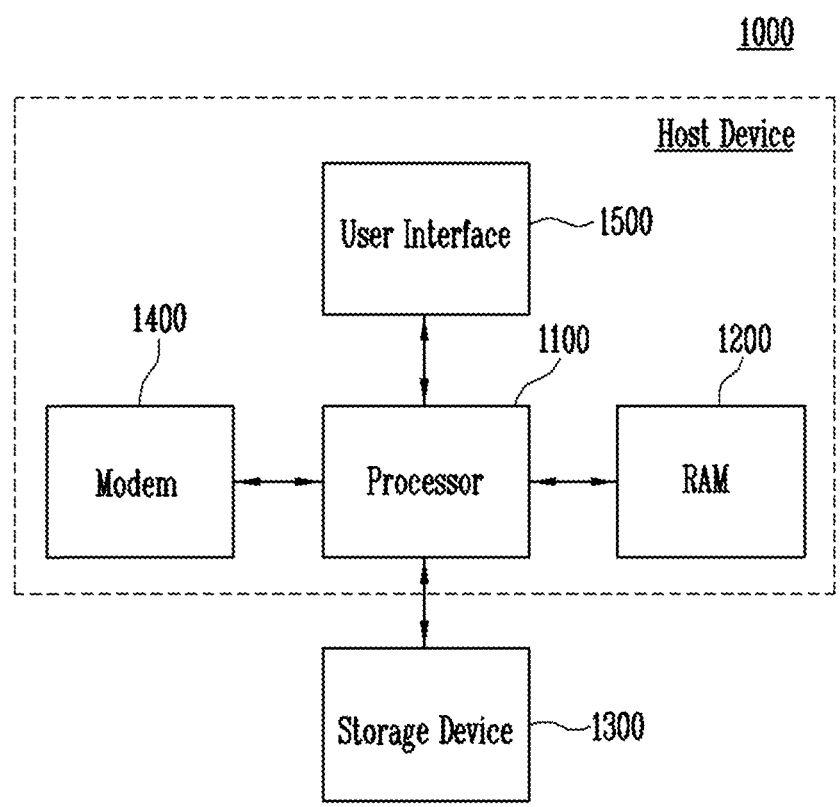
FIG. 26 is a block diagram illustrating a computing device in accordance with an embodiment of the present disclosure.

FIG. 26 is a block diagram illustrating a computing device 1000 in accordance with an embodiment of the present disclosure.

Referring to FIG. 26, the computing device 1000 may include a processor 1100, a memory (i.e. RAM) 1200, a storage device 1300, a modem 1400, and a user interface 1500.

The processor 1100 may control the overall operation of the computing device 1000 and perform a logical operation. For example, the processor 1100 may be formed of a system-on-chip (SoC). The processor 1100 may be a general purpose processor, a special-purpose processor, or an application processor.

The RAM 1200 may communicate with the processor 1100. The RAM 1200 may be a main memory of the processor 1100 or the computing device 1000. The processor 1100 may temporarily store codes or data in the RAM 1200. The processor 1100 may execute the codes using the RAM 1200 and process the data. The processor 1100 may execute a variety of software, such as an operating system and an application, using the RAM 1200. The processor 1100 may control the overall operation of the computing device 1000 using the RAM 1200. The RAM 1200 may include a volatile memory such as a static RAM (SRAM), a dynamic RAM (DRAM), or a synchronous DRAM (SDRAM), or a nonvolatile memory such as a phase-change RAM (PRAM), a magnetic RAM (MRAM), a resistive RAM (RRAM), or a ferroelectric RAM (FeRAM).

The storage device 1300 may communicate with the processor 1100. The storage device 1300 may be used to store data for a long period of time. In other words, the processor 1100 may store data, which is to be stored for a long period of time, in the storage device 1300. The storage device 1300 may store a boot image for driving the computing device 1000. The storage device 1300 may store source codes of a variety of software, such as an operating system and an application. The storage device 1300 may store data processed by a variety of software, such as an operating system and an application.

In an embodiment, the processor 1100 may load source codes stored in the storage device 1300 on the RAM 1200, and execute the codes loaded on the RAM 1200, thus driving a variety of software, such as an operating system, and an application. The processor 1100 may load data stored in the storage device 1300 on the RAM 1200, and process the data loaded on the RAM 1200. The processor 1100 may store long-term data of the data stored in the RAM 1200 in the storage device 1300.

The storage device 1300 may include a nonvolatile memory, such as a flash memory, a phase-change RAM (PRAM), a magnetic RAM (MRAM), a resistive RAM (RRAM), and a ferroelectric RAM (FRAM).

The modem 1400 may communicate with an external device under the control of the processor 1100. For example, the modem 1400 may communicate with the external device in a wire or wireless manner. The modem 1400 may communicate with the external device, based on at least one of wireless communication manners such as Long Term Evolution (LTE), WiMax, Global System for Mobile communication (GSM), Code Division Multiple Access (CDMA), Bluetooth, Near Field Communication (NFC), WiFi, Radio Frequency Identification (RFID) and so on, or wire communication manners such as Universal Serial Bus (USB), Serial AT Attachment (SATA), High Speed Interchip (HSIC), Small Computer System Interface (SCSI), Firewire, Peripheral Component Interconnection (PCI), PCI express (PCIe), NonVolatile Memory express (NVMe), Universal Flash Storage (UFS), Secure Digital (SD), Secure Digital Input Output (SDIO), Universal Asynchronous Receiver Transmitter (UART), Serial Peripheral Interface (SPI), High Speed SPI (HS-SPI), RS232, Inter-integrated Circuit (I2C), HS-I2C, Integrated-interchip Sound (I2S), Sony/Philips Digital Interface (S/PDIF), MultiMedia Card (MMC), embedded MMC (eMMC), and so on.

The user interface 1500 may communicate with a user under the control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an a Liquid Crystal Display (LCD), an Organic Light Emitting Diode (OLED) display device, an Active Matrix OLED (AMOLED) display device, an LED, a speaker, a motor, and so on.

The storage device 1300 may include at least one of storage devices 100, 200, 300, 400, and 500 according to embodiments of the present disclosure. The processor 1100, the RAM 1200, the modem 1400, and the user interface 1500 may form a host device that communicates with the storage device 1300. While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure .

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic concepts described herein will still fall within the spirit and scope of the present disclosure as defined in the appended claims and their equivalents.

Various embodiments of the present disclosure may provide a storage device having improved reliability, and a method of operating the storage device.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A storage device comprising:
a semiconductor memory device; and
a memory controller configured to control the semiconductor memory device and transmit write data and a first timing signal to the semiconductor memory device during a write operation,
wherein the semiconductor memory device comprises:
a memory unit configured to store the write data; and
an interface chip configured to detect a locking delay from the first timing signal and generate a third timing signal using a second timing signal which is generated by delaying the first timing signal using the detected locking delay by at least two periods,
wherein the interface chip comprises:
a first receiving node configured to receive the first timing signal from the memory controller;
a delay-locked loop configured to detect a locking delay of an inputted signal received from a first multiplexer and generate the third timing signal delayed by the detected locking delay;
a delay circuit configured to receive the first timing signal and output the second timing signal, generated by delaying the first timing signal by at least two periods, to the delay-locked loop; and
the first multiplexer configured to provide either the first timing signal or the second timing signal to the delay-locked loop.

2. The storage device according to claim 1, wherein the interface chip is configured to retime the write data by latching the write data in synchronization with the third timing signal, and output the third timing signal and the retimed write data to the memory unit.

3. The storage device according to claim 1, wherein the second timing signal is a delayed data strobe signal and the third timing signal is an internal signal (iDQS).

4. The storage device according to claim 1, wherein the interface chip comprises:
a second receiving node configured to receive the write data from the memory controller;
a flip-flop configured to receive and output the write data in synchronization with the third timing signal outputted from the delay-locked loop; and
a first transmitting node configured to transmit an output of the flip-flop to the memory unit as write data that has been retimed.

5. The storage device according to claim 4, wherein the third timing signal is a signal generated by delaying, by at least two periods, a data strobe signal (DQS) which is toggled by the memory controller during a write operation of the memory unit.

6. The storage device according to claim 1,
wherein the memory controller transmits a fourth timing signal to the semiconductor memory device during a read operation,
wherein the memory unit outputs read data and a fifth timing signal in response to the fourth timing signal, and
wherein the interface chip detects a locking delay according to the fourth timing signal, generates a sixth timing signal from the fifth timing signal using the detected locking delay, retimes the read data by latching the read data in synchronization with the sixth timing signal, and outputs the sixth timing signal and the retimed read data to the memory controller.

7. The storage device according to claim 6, wherein the interface chip comprises:
a first receiving node configured to receive the fourth timing signal from the memory controller;
a first transmitting node configured to transmit, to the memory unit, the fourth timing signal received through the first receiving node;
a second receiving node configured to receive the fifth timing signal from the memory unit;
a delay-locked loop configured to detect the locking delay from the fourth timing signal received through the first receiving node, and generate the sixth timing signal using the detected locking delay from the fifth timing signal received from the second receiving node; and
a second transmitting node configured to output, to the memory controller, the sixth timing signal outputted from the delay-locked loop.

8. The storage device according to claim 7, wherein the interface chip comprises:
a third receiving node configured to receive the read data outputted from the memory unit;
a flip-flop configured to receive and output the read data received through the third receiving node, in synchronization with the sixth timing signal outputted from the delay-locked loop; and
a third transmitting node configured to output an output of the flip-flop to the memory controller as the read data that has been retimed.

9. The storage device according to claim 1, wherein the first timing signal is a data strobe signal (DQS) to be toggled by the memory controller.

10. The storage device according to claim 9, wherein the third timing signal is an internal signal (iDQS) and the second timing signal is a write enable signal.

11. The storage device according to claim 8,
wherein the fourth timing signal is a read enable signal (RE) to be toggled by the memory controller during a read operation of the semiconductor memory device, wherein the fifth timing signal is a data strobe signal (DQS) to be generated by the memory unit based on the read enable signal during the read operation, wherein the sixth timing signal is a signal delayed from the fifth timing signal by a quarter period, and wherein the read data that has been retimed is delayed from the read data by a quarter period of the sixth timing signal.

12. A semiconductor memory device comprising:

a memory unit configured to store the write data; and an interface chip configured to receive a first timing signal and a second timing signal, and configured to detect a locking delay from the first timing signal and generate a third timing signal using the second timing signal which is generated by delaying the first timing signal using the detected locking delay by at least two periods, wherein the interface chip comprises:

a first receiving node configured to receive the first timing signal from the memory controller;

a delay-locked loop configured to detect a locking delay of an inputted signal received from a first multiplexer and generate the third timing signal delayed by the detected locking delay;

a delay circuit configured to receive the first timing signal and output the second timing signal, generated by delaying the first timing signal by at least two periods, to the delay-locked loop; and the first multiplexer configured to provide either the first timing signal or the second timing signal to the delay-locked loop.

13. The semiconductor memory device according to claim 12, wherein the interface chip is configured to retime the write data by latching the write data in synchronization with the third timing signal, and output the third timing signal and the retimed write data to the memory unit.

14. The semiconductor memory device according to claim 12, wherein the second timing signal is a delayed data strobe signal and the third timing signal is an internal signal (iDQS).

15. The semiconductor memory device according to claim 12, wherein the interface chip comprises:

a second receiving node configured to receive the write data externally from the semiconductor memory device;

a flip-flop configured to receive and output the write data in synchronization with the third timing signal outputted from the delay-locked loop; and a first transmitting node configured to transmit an output of the flip-flop to the memory unit as write data that has been retimed.

16. The semiconductor memory device according to claim 15, wherein the third timing signal is a signal generated by delaying, by at least two periods, a data strobe signal (DQS) which is toggled by the memory controller during a write operation of the memory unit.

17. The semiconductor memory device according to claim 12, wherein the interface chip receives a fourth timing signal during a read operation, wherein the memory unit outputs read data and a fifth timing signal in response to the fourth timing signal, and wherein the interface chip detects a locking delay according to the fourth timing signal, generates a sixth timing signal from the fifth timing signal using the detected locking delay, retimes the read data by latching the read data in synchronization with the sixth timing signal, and outputs the sixth timing signal and the retimed read data to the memory controller.

18. The semiconductor memory device according to claim 17, wherein the interface chip comprises:

a first receiving node configured to receive the fourth timing signal from the memory controller;

a first transmitting node configured to transmit, to the memory unit, the fourth timing signal received through the first receiving node;

a second receiving node configured to receive the fifth timing signal from the memory unit;

a delay-locked loop configured to detect the locking delay from the fourth timing signal received through the first receiving node, and generate the sixth timing signal using the detected locking delay from the fifth timing signal received from the second receiving node; and a second transmitting node configured to output, to the memory controller, the sixth timing signal outputted from the delay-locked loop.

* * * * *